United States Patent
Ozawa et al.

(10) Patent No.: US 12,302,022 B2
(45) Date of Patent: May 13, 2025

(54) ANALOG-TO-DIGITAL CONVERSION CIRCUIT, SOLID-STATE IMAGE SENSOR, AND METHOD FOR CONTROLLING ANALOG-TO-DIGITAL CONVERSION CIRCUIT

(71) Applicant: SONY SEMICONDUCTOR SOLUTIONS CORPORATION, Kanagawa (JP)

(72) Inventors: Yuki Ozawa, Kanagawa (JP); Hiromu Kato, Kanagawa (JP); Atsushi Suzuki, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 102 days.

(21) Appl. No.: 18/245,567

(22) PCT Filed: Aug. 11, 2021

(86) PCT No.: PCT/JP2021/029605
§ 371 (c)(1),
(2) Date: Mar. 16, 2023

(87) PCT Pub. No.: WO2022/074931
PCT Pub. Date: Apr. 14, 2022

(65) Prior Publication Data
US 2023/0370746 A1    Nov. 16, 2023

(30) Foreign Application Priority Data

Oct. 6, 2020 (JP) .................................. 2020-168978

(51) Int. Cl.
*H04N 25/772* (2023.01)
*H03M 1/34* (2006.01)
*H03M 1/50* (2006.01)

(52) U.S. Cl.
CPC ............ *H04N 25/772* (2023.01); *H03M 1/34* (2013.01); *H03M 1/50* (2013.01)

(58) Field of Classification Search
CPC ...... H04N 25/772; H04N 25/78; H04N 25/77; H03M 1/34; H03M 1/50; H03M 1/123; H03M 1/56
See application file for complete search history.

(56) References Cited

U.S. PATENT DOCUMENTS

| 2009/0026352 A1* | 1/2009 | Shimomura | H04N 25/78 250/214 R |
| 2012/0313803 A1* | 12/2012 | Dosho | G04F 10/005 341/166 |
| 2019/0109599 A1* | 4/2019 | Matsuzawa | H03M 1/121 |

FOREIGN PATENT DOCUMENTS

| JP | 2015-128278 A | 7/2015 |
| WO | 2012/133192 A1 | 10/2012 |

(Continued)

OTHER PUBLICATIONS

International Search Report and Written Opinion of PCT Application No. PCT/JP2021/029605, issued on Sep. 7, 2021, 10 pages of ISRWO.

*Primary Examiner* — Christopher K Peterson
(74) *Attorney, Agent, or Firm* — CHIP LAW GROUP

(57) ABSTRACT

Power consumption is reduced in an analog-to-digital conversion circuit using a TDC. The analog-to-digital conversion circuit includes a comparator, a counter, a time-to-digital converter, and a holding unit. The comparator compares an analog signal with a predetermined reference signal and outputs a comparison result. The counter counts a predetermined count value and outputs a bit string indicating the count value. The time-to-digital converter converts, into a digital signal, a time from when the comparison result is inverted until a least significant bit of the bit string (Continued)

reaches a predetermined value. The holding unit holds the
bit string of when the comparison result is inverted.

11 Claims, 20 Drawing Sheets

(56) References Cited

FOREIGN PATENT DOCUMENTS

| | | |
|---|---|---|
| WO | 2013/122221 A1 | 8/2013 |
| WO | 2016/056394 A1 | 4/2016 |
| WO | 2017/183117 A1 | 10/2017 |

* cited by examiner

ANALOG-TO-DIGITAL CONVERSION CIRCUIT, SOLID-STATE IMAGE SENSOR, AND METHOD FOR CONTROLLING ANALOG-TO-DIGITAL CONVERSION CIRCUIT

CROSS REFERENCE TO RELATED APPLICATIONS

This application is a U.S. National Phase of International Patent Application No. PCT/JP2021/029605 filed on Aug. 11, 2021, which claims priority benefit of Japanese Patent Application No. JP 2020-168978 filed in the Japan Patent Office on Oct. 6, 2020. Each of the above-referenced applications is hereby incorporated herein by reference in its entirety.

TECHNICAL FIELD

The present technology relates to an analog-to-digital conversion circuit. Specifically, the present technology relates to an analog-to-digital conversion circuit using a circuit that converts time into a digital signal, a solid-state image sensor, and a method for controlling the analog-to-digital conversion circuit.

BACKGROUND ART

Conventionally, for a solid-state image sensor or the like, a column analog-to-digital converter (ADC) in which an ADC is disposed for each pixel column has been used. For example, there has been proposed a solid-state image sensor in which an ADC including a comparator, and a time-to-digital converter (TDC) that converts, into a digital signal, a time until output of the comparator is inverted are disposed for each column (refer to Patent Document 1, for example).

CITATION LIST

Patent Document

Patent Document 1: Japanese Patent Application Laid-Open No. 2015-128278

SUMMARY OF THE INVENTION

Problems to be Solved by the Invention

In the above-described conventional technique, resolution of the ADC is improved by using a TDC having time resolution higher than time resolution of a counter. However, because a TDC needs to always oscillate a plurality of ring oscillators therein during time-to-digital conversion, power consumption by the TDC is generally higher than power consumption by a counter in which only a flip-flop or logic gate to be updated is required to be operated. Therefore, the above-described solid-state image sensor has a problem that power consumption increases as compared with a case where a counter is used instead of the TDC.

The present technology has been developed in view of such a situation, and an object thereof is to reduce power consumption in an analog-to-digital conversion circuit using a TDC.

Solutions to Problems

The present technology has been made to solve the above-described problem, and a first aspect thereof is an analog-to-digital conversion circuit including a comparator that compares an analog signal and a predetermined reference signal, and outputs a comparison result, a counter that counts a predetermined count value and outputs a bit string indicating the count value, a time-to-digital converter that converts, into a digital signal, a time from when the comparison result is inverted until a least significant bit of the bit string reaches a predetermined value, and a holding unit that holds the bit string of when the comparison result is inverted, and a method for controlling thereof. This allows reduction in power consumption of the analog-to-digital conversion circuit.

Furthermore, in the first aspect, the bit string and the digital signal may be a Gray code. This allows a reduction in power consumption as compared with a case of using a binary counter.

Furthermore, in the first aspect, the time-to-digital converter may generate the digital signal indicating a value counted down from a predetermined initial value over a time from when the comparison result is inverted until the least significant bit reaches the predetermined value, and the initial value may include a value of when the time-to-digital converter counts up over a period of the least significant bit. This allows to obtain a difference between the period of the least significant bit and the time from when the comparison result is inverted until the least significant bit reaches the predetermined value.

Furthermore, in the first aspect, the time-to-digital converter may include a ring oscillator that generates a predetermined alternating current signal, and a variable capacitor that controls a delay time of the alternating current signal according to a predetermined control signal. This allows the delay time of the alternating current signal to be adjusted.

Furthermore, in the first aspect, an oscillation frequency adjustment unit that adjusts, with the control signal, an oscillation frequency of the ring oscillator may be further included. This allows the oscillation frequency to be calibrated.

Furthermore, in the first aspect, the oscillation frequency adjustment unit may include a frequency divider that divides a frequency of the alternating current signal, a first counter that counts a first count value in synchronization with the alternating current signal of which frequency is divided, a second counter that counts a second count value in synchronization with a predetermined reference clock signal, and a comparison unit that generates a digital signal as the control signal on the basis of a result of comparing the first count value with the second count value. This allows the oscillation frequency to be adjusted by the digital signal.

Furthermore, in the first aspect, the oscillation frequency adjustment unit may further include a digital-to-analog converter that performs digital-to-analog conversion on the control signal. This allows the oscillation frequency to be adjusted by an analog signal.

Furthermore, in the first aspect, the time-to-digital converter may include a start signal generation unit that generates a start signal indicating a start timing of time-to-digital conversion on the basis of the comparison result and the least significant bit, an end signal generation unit that generates an end signal indicating an end timing of the time-to-digital conversion on the basis of the comparison result and the least significant bit, a delay unit that delays the end signal over a predetermined delay time, and a conversion circuit that performs the time-to-digital conversion on the basis of the start signal and the delayed end signal to generate the digital signal. This allows the digital signal to be generated on the basis of the start signal and the delayed end signal.

Furthermore, in the first aspect, a delay time adjustment unit that adjusts the delay time may be further included. This allows the delay time of the end signal to be adjusted.

Furthermore, a second aspect of the present technology is a solid-state image sensor including a pixel that generates an analog signal with photoelectric conversion, a comparator that compares the analog signal and a predetermined reference signal, and outputs a comparison result, a counter that counts a predetermined count value and outputs a bit string indicating the count value, a time-to-digital converter that converts, into a digital signal, a time from when the comparison result is inverted until a least significant bit of the bit string reaches a predetermined value, and a holding unit that holds the bit string of when the comparison result is inverted. This allows reduction in power consumption of the solid-state image sensor.

MODE FOR CARRYING OUT THE INVENTION

Figure 1:
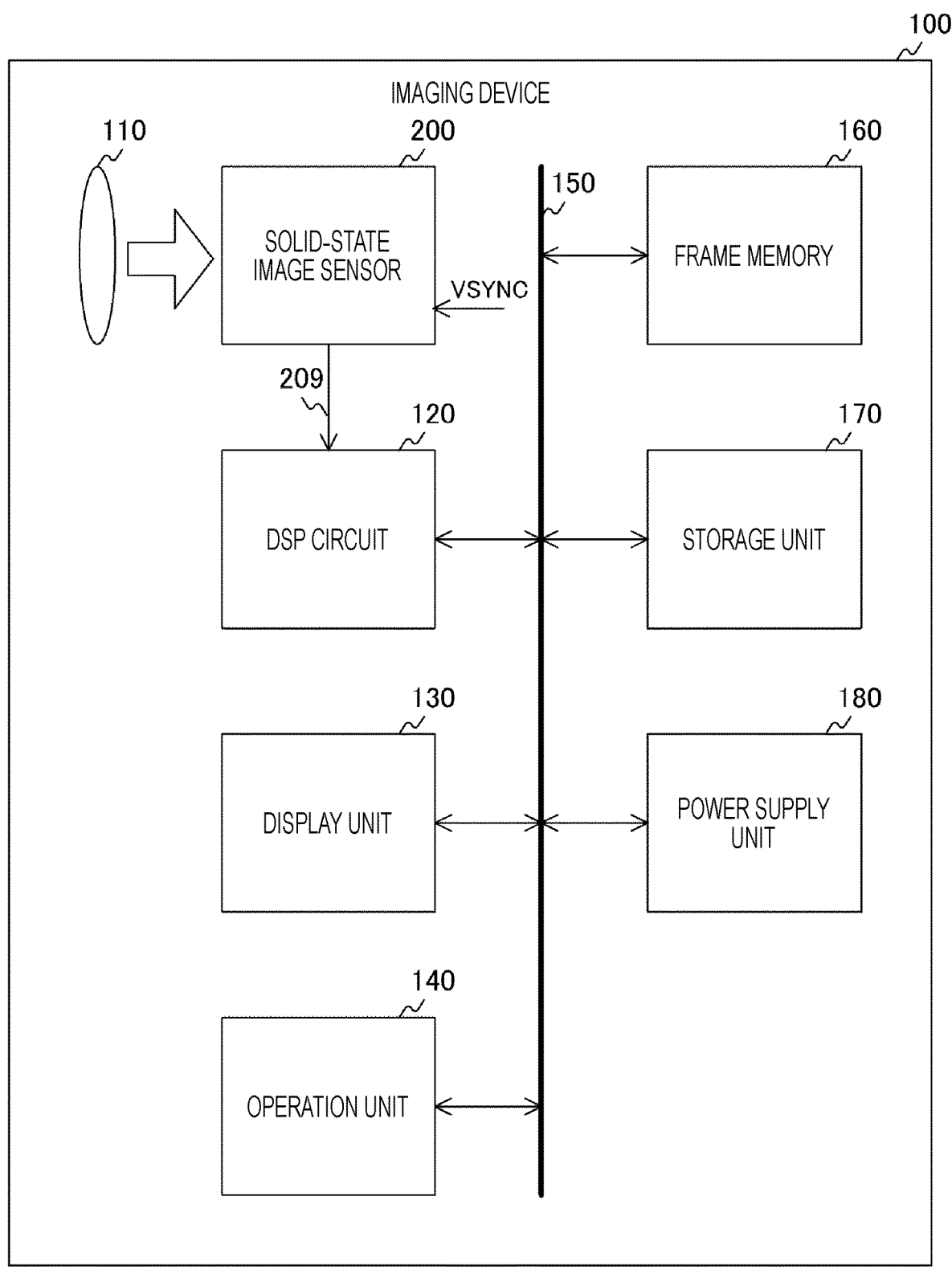
FIG. 1 is a block diagram illustrating a configuration example of an imaging device according to a first embodiment of the present technology.

Modes for carrying out the present technology (hereinafter, referred to as embodiments) will be described below. The description will be made in the following order.
1. First embodiment (example of performing AD conversion by using counter and TDC)
2. Second embodiment (example of performing AD conversion by using counter and TDC after adjusting oscillation frequency)
3. Third embodiment (example of performing AD conversion by using counter and TDC after adjusting delay time)
4. Example of application to mobile object 1. First Embodiment Configuration Example of Imaging Device FIG. 1 is a block diagram illustrating a configuration example of an imaging device 100 according to a first embodiment of the present technology. The imaging device 100 is a device for capturing image data, and includes an optical unit 110, a solid-state image sensor 200, and a digital signal processing (DSP) circuit 120. The imaging device 100 further includes a display unit 130, an operation unit 140, a bus 150, a frame memory 160, a storage unit 170, and a power supply unit 180. As the imaging device 100, for example, in addition to a digital camera such as a digital still camera, a smartphone, a personal computer, a vehicle-mounted camera, or the like having an imaging function is assumed.

The optical unit 110 condenses light from a subject and guides the light to the solid-state image sensor 200. The solid-state image sensor 200 generates image data by photoelectric conversion in synchronization with a vertical synchronization signal VSYNC. Here, the vertical synchronization signal VSYNC is a periodic signal of a predetermined frequency indicating a timing of capturing an image. The solid-state image sensor 200 supplies the generated image data to a DSP circuit 120 via a signal line 209.

The DSP circuit 120 executes predetermined signal processing on the image data from the solid-state image sensor 200. The DSP circuit 120 outputs the processed image data to the frame memory 160 or the like via the bus 150.

The display unit 130 displays image data. As the display unit 130, for example, a liquid crystal panel or an organic electro luminescence (EL) panel is assumed. The operation unit 140 generates an operation signal according to operation by a user.

The bus 150 is a common path for the optical unit 110, the solid-state image sensor 200, the DSP circuit 120, the display unit 130, the operation unit 140, the frame memory 160, the storage unit 170, and the power supply unit 180 to exchange data with one another.

The frame memory 160 holds image data. The storage unit 170 stores various data such as image data. The power supply unit 180 supplies power to the solid-state image sensor 200, the DSP circuit 120, the display unit 130, and the like.

[Configuration Example of Solid-State Image Sensor]

Figure 2:
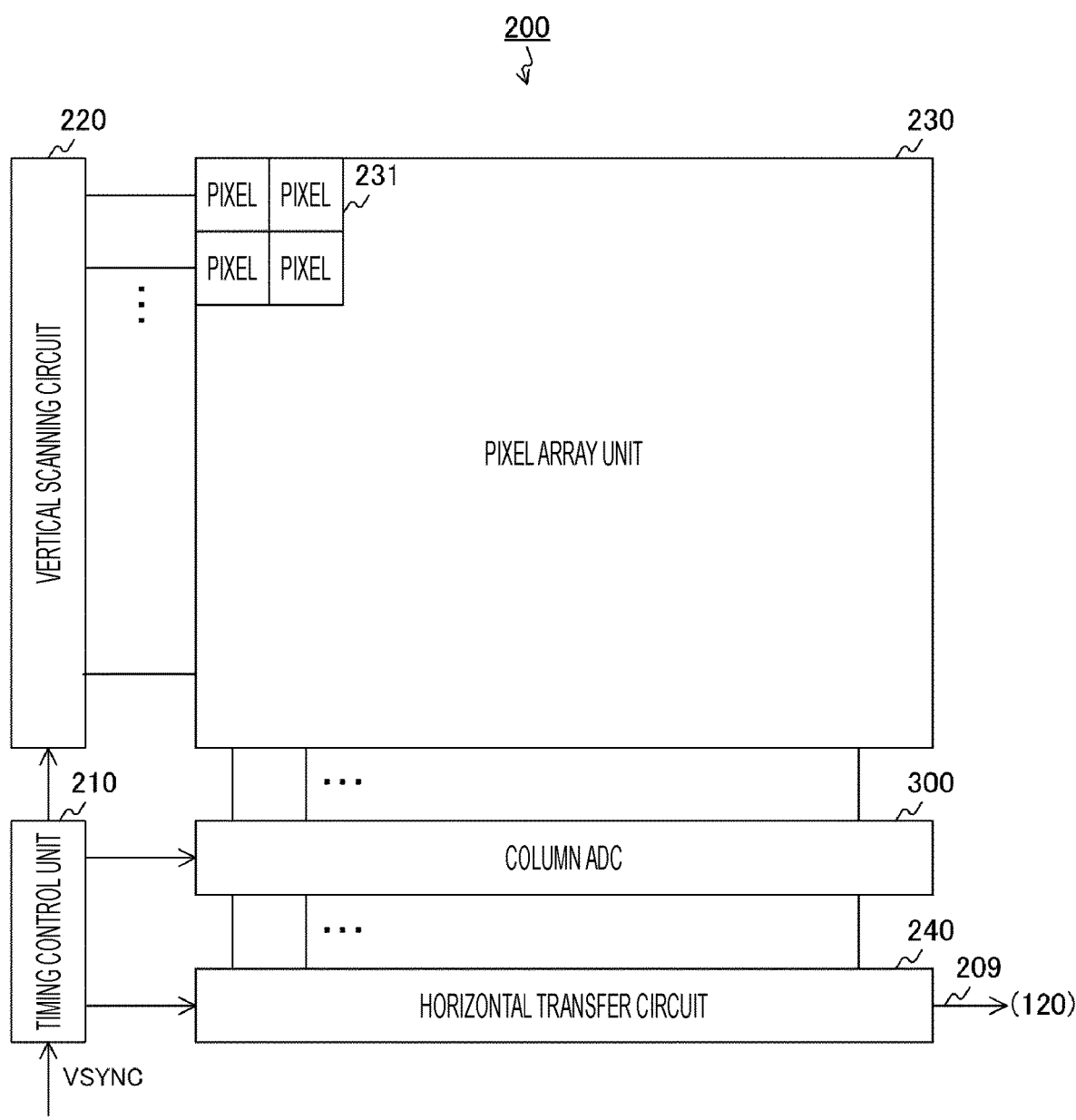
FIG. 2 is a block diagram illustrating a configuration example of a solid-state image sensor according to the first embodiment of the present technology.

FIG. 2 is a block diagram illustrating a configuration example of the solid-state image sensor 200 according to the first embodiment of the present technology. The solid-state image sensor 200 includes a timing control unit 210, a vertical scanning circuit 220, a pixel array unit 230, a column ADC 300, and a horizontal transfer circuit 240. In the pixel array unit 230, a plurality of pixels 231 is arranged in a two-dimensional lattice pattern.

The timing control unit 210 controls operation timing of each of the vertical scanning circuit 220, the column ADC 300, and the horizontal transfer circuit 240 in synchronization with the vertical synchronization signal VSYNC.

The vertical scanning circuit 220 sequentially drives rows of the pixels 231 to output analog pixel signals. The pixel 231 generates a pixel signal with photoelectric conversion and outputs the pixel signal to the column ADC 300 under control of the vertical scanning circuit 220.

The column ADC 300 performs analog to digital (AD) conversion on each pixel signal of a column. The column ADC 300 supplies the AD-converted digital signal to the horizontal transfer circuit 240 as pixel data.

The horizontal transfer circuit 240 sequentially outputs the pixel data to the DSP circuit 120. The image data in which the pixel data is arranged is processed by the DSP circuit 120.

[Configuration Example of Column ADC]

Figure 3:
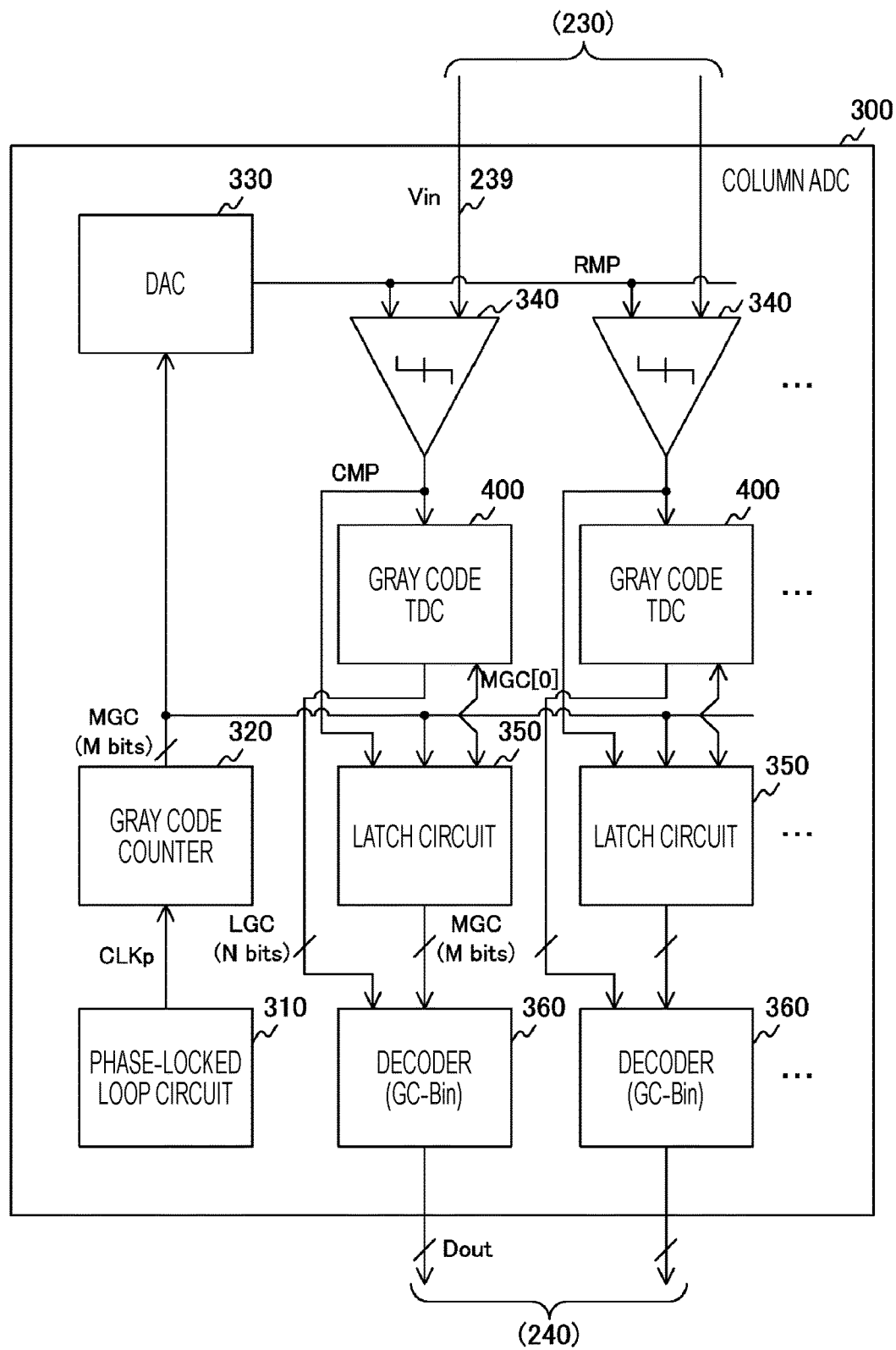
FIG. 3 is a block diagram illustrating a configuration example of a column ADC according to the first embodiment of the present technology.

FIG. 3 is a block diagram illustrating a configuration example of the column ADC 300 according to the first embodiment of the present technology. The column ADC 300 includes a phase-locked loop circuit 310, a Gray code counter 320, and a digital to analog converter (DAC) 330. Furthermore, the column ADC 300 includes a comparator 340, a Gray code TDC 400, a latch circuit 350, and a decoder 360 for each column. In a case where the number of the columns is K (K is an integer), a K number of comparators 340, Gray code TDCs 400, latch circuits 350, and decoders 360 are disposed. Note that the column ADC 300 is an example of an analog-to-digital conversion circuit described in the claims.

The phase-locked loop circuit 310 generates a predetermined periodic signal. For example, the phase-locked loop circuit 310 generates a clock signal CLKp as a periodic signal and supplies the clock signal CLKp to the Gray code counter 320.

The Gray code counter 320 counts a count value in synchronization with the clock signal CLKp. The Gray code counter 320 generates a Gray code indicating a count value as a high-order code MGC, and supplies the Gray code to each of the DAC 330 and the latch circuit 350. A data size of the high-order code MGC is M (M is an integer) bits. Furthermore, an m-th (m is an integer from 0 to M−1) digit bit of the high-order code MGC is represented as MGC [m]. Among the M bits, MGC [0] is a least significant bit (LSB), and this bit is also supplied to each of the Gray code TDCs 400. Note that the Gray code counter 320 is an example of a counter described in the claims.

The DAC 330 generates a predetermined reference signal RMP by digital-to-analog conversion in synchronization with the high-order code MGC from the Gray code counter 320. For example, a sawtooth-shaped ramp signal is generated as the reference signal RMP. The DAC 330 supplies the reference signal RMP to each of the comparators 340.

The comparator 340 has two input terminals. A pixel signal Vin (analog signal) from a pixel of a corresponding column is input to one of these input terminals, and the reference signal RMP from the DAC 330 is input to another input terminal. The comparator 340 compares the pixel signal Vin with the reference signal RMP, and outputs a comparison result CMP to the Gray code TDC 400 and the latch circuit 350.

The Gray code TDC 400 converts a time from when the comparison result CMP is inverted to when the least significant bit MGC [0] reaches a high level into a Gray code (digital signal). The Gray code TDC 400 supplies the converted Gray code to the decoder 360 as a low-order code LGC. A data size of the low-order code LGC is N (N is an integer) bits. Furthermore, an n-th (n is an integer from 0 to N−1) digit bit of the low-order code LGC is represented as LGC [n]. Note that the Gray code TDC 400 is an example of a time-to-digital converter described in the claims.

The latch circuit 350 holds the high-order code MGC from the Gray code counter 320 when the comparison result CMP is inverted. The latch circuit 350 supplies the held high-order code MGC to the decoder 360. Note that the latch circuit 350 is an example of a holding unit described in the claims.

The decoder 360 converts, into a binary code, the Gray code having the high-order code MGC as a high-order digit and the low-order code LGC as a low-order digit. Because the high-order code MGC is M bits and the low-order code LGC is N bits, a data size of the Gray code is (M+N) bits. The decoder 360 supplies the binary code to the horizontal transfer circuit 240 as pixel data Dout.

[Configuration Example of Gray Code TDC]

Figure 4:
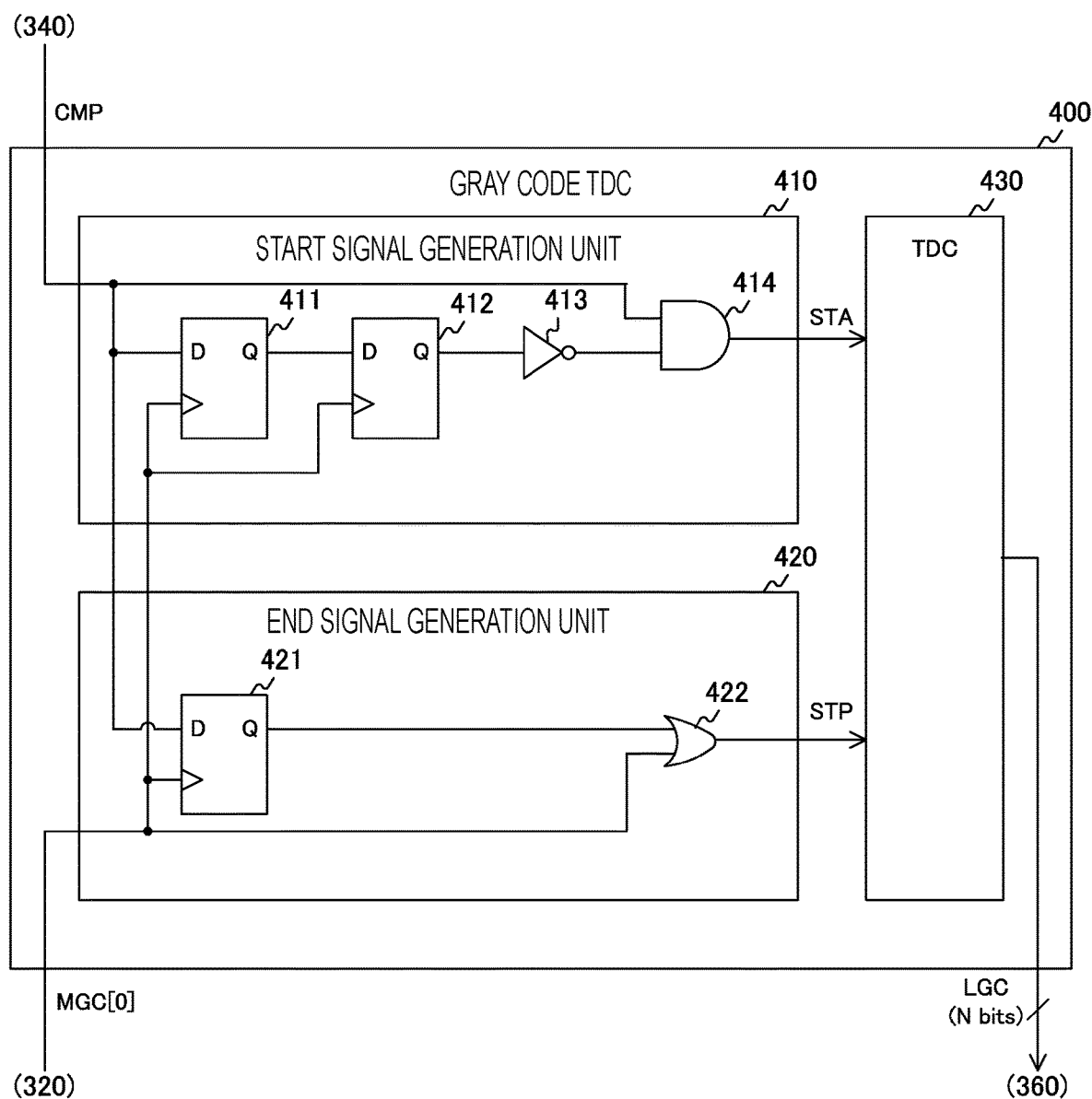
FIG. 4 is a circuit diagram illustrating a configuration example of a Gray code TDC according to the first embodiment of the present technology.

FIG. 4 is a circuit diagram illustrating a configuration example of the Gray code TDC 400 according to the first embodiment of the present technology. The Gray code TDC 400 includes a start signal generation unit 410, an end signal generation unit 420, and a TDC 430.

The start signal generation unit 410 generates a start signal STA indicating a start timing of a time-to-digital conversion on the basis of the comparison result CMP from the comparator 340 and the least significant bit MGC [0]. When the start signal STA reaches the high level, the ring oscillators in the TDC 430 are activated, and the time-to-digital conversion by the TDC 430 is started. Then, when the start signal STA reaches a low level after the time-to-digital conversion by an end signal STP to be described later stops, the ring oscillators in the TDC 430 are powered down. The start signal generation unit 410 includes flip-flops 411 and 412, an inverter 413, and an AND (logical AND) gate 414.

The flip-flop 411 holds the comparison result CMP in synchronization with the least significant bit MGC [0]. The flip-flop 411 supplies a held value to the flip-flop 412.

The flip-flop 412 holds a signal from the flip-flop 411 in synchronization with the least significant bit MGC [0]. The flip-flop 412 supplies a held value to the inverter 413.

The inverter 413 inverts the signal from the flip-flop 412 and supplies the inverted signal to the AND gate 414.

The AND gate 414 calculates a logical AND of the comparison result CMP and the signal from the inverter 413. The AND gate 414 supplies the logical AND to the TDC 430 as the start signal STA.

The end signal generation unit 420 generates an end signal STP indicating an end timing of a time-to-digital conversion on the basis of the comparison result CMP from the comparator 340 and the least significant bit MGC [0]. The end signal generation unit 420 includes a flip-flop 421 and an OR (logical OR) gate 422.

The flip-flop 421 holds the comparison result CMP in synchronization with the least significant bit MGC [0]. The flip-flop 421 supplies a held value to the OR gate 422.

A NOR gate 422 calculates a logical NOR of the signal from the flip-flop 421 and the least significant bit MGC [0]. The OR gate 422 supplies a logical OR to the TDC 430 as the end signal STP.

The TDC 430 performs time-to-digital conversion on the basis of the start signal STA and the end signal STP. The TDC 430 generates the low-order code LGC by the time-to-digital conversion and supplies the low-order code LGC to the decoder 360. Note that the TDC 430 is an example of a conversion circuit described in the claims.

[Configuration Example of TDC]

Figure 5:
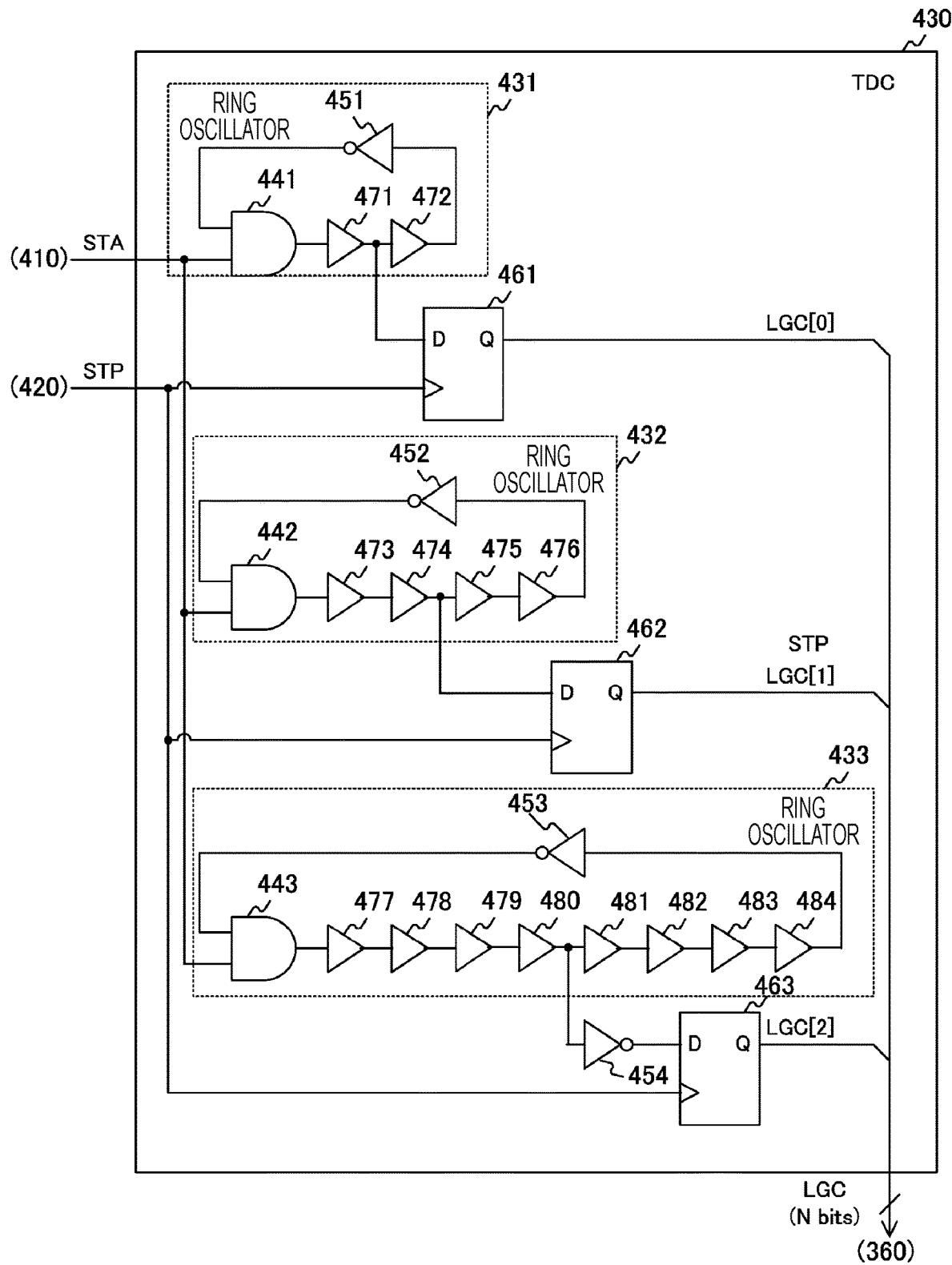
FIG. 5 is a circuit diagram illustrating a configuration example of a TDC according to the first embodiment of the present technology.

FIG. 5 is a circuit diagram illustrating a configuration example of the TDC 430 according to the first embodiment of the present technology. The TDC 430 includes ring oscillators 431 to 433, an inverter 454, and flip-flops 461 to 463.

The ring oscillators 431 to 433 generate alternating current (AC) signals having periods different from one another. The ring oscillator 431 includes an AND gate 441, buffers 471 and 472, and an inverter 451.

The AND gate 441 supplies the buffer 471 with a logical AND of the start signal STA from the start signal generation unit 410 and a signal from the inverter 451. The buffer 471 delays the signal from the AND gate 441 and supplies the delayed signal to the buffer 472 and the flip-flop 461. The buffer 472 delays the signal from the buffer 471 and supplies the delayed signal to the inverter 451. The inverter 451 inverts the signal from the buffer 472 and supplies the inverted signal to the AND gate 441.

The flip-flop 461 holds the signal from the ring oscillator 431 in synchronization with the end signal STP from the end signal generation unit 420. The flip-flop 461 supplies a held value as LGC [0] to the decoder 360.

The ring oscillator 432 includes an AND gate 442, buffers 473 to 476, and an inverter 452. A circuit configuration of the ring oscillator 432 is similar to a circuit configuration of the ring oscillator 431 except that the number of the buffers is different. Furthermore, the buffer 474 supplies a delayed signal to the buffer 475 and the flip-flop 462.

The flip-flop 462 holds the signal from the ring oscillator 432 in synchronization with the end signal STP. The flip-flop 462 supplies a held value as LGC [1] to the decoder 360.

The ring oscillator 433 includes an AND gate 443, buffers 477 to 484, and an inverter 453. A circuit configuration of the ring oscillator 433 is similar to the circuit configuration of the ring oscillator 431 except that the number of the buffers is different. Furthermore, the buffer 480 supplies a delayed signal to the buffer 481 and the inverter 454.

The inverter 454 inverts a signal from the ring oscillator 433 and supplies the inverted signal to the flip-flop 463.

The flip-flop 463 holds the signal from the inverter 454 in synchronization with the end signal STP. The flip-flop 462 supplies the held value as LGC [2] to the decoder 360.

[Operation Example of Solid-State Image Sensor]

Figure 6:
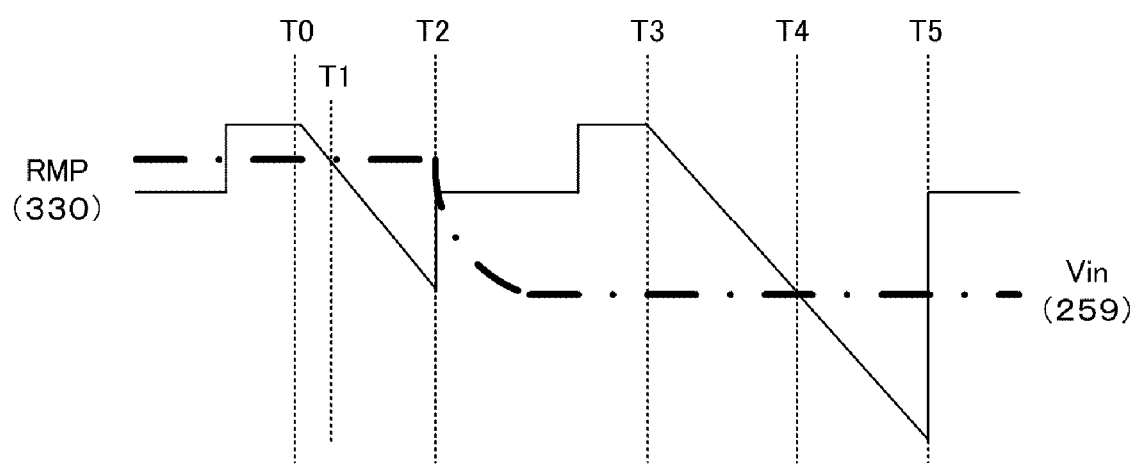
FIG. 6 is a timing chart illustrating an example of operation of a DAC according to the first embodiment of the present technology.

FIG. 6 is a timing chart illustrating an example of operation of a DAC 330 according to the first embodiment of the present technology. An alternate long and short dash line in the drawing indicates a locus of the pixel signal Vin. A solid line indicates a locus of the reference signal RMP.

A level of the pixel signal Vin is at a reset level over a period up to a timing T2. Here, the reset level is a level of the pixel signal Vin when a floating diffusion layer in the pixel 231 is initialized.

The DAC 330 lowers the reference signal RMP with time over an AD conversion period from a timing T0 to a timing T2. The reset level and the reference signal RMP substantially coincide with each other at the timing T1 within the AD conversion period.

Then, from the timing T2, the level of the pixel signal Vin changes to a signal level. Here, the signal level is a level of the pixel signal Vin when a charge is transferred to the floating diffusion layer in the pixel 231.

The DAC 330 lowers the reference signal RMP with time over an AD conversion period from a timing T3 to a timing T5. The signal level and the reference signal RMP substantially coincide with each other at a timing T4 within the AD conversion period.

Figure 7:
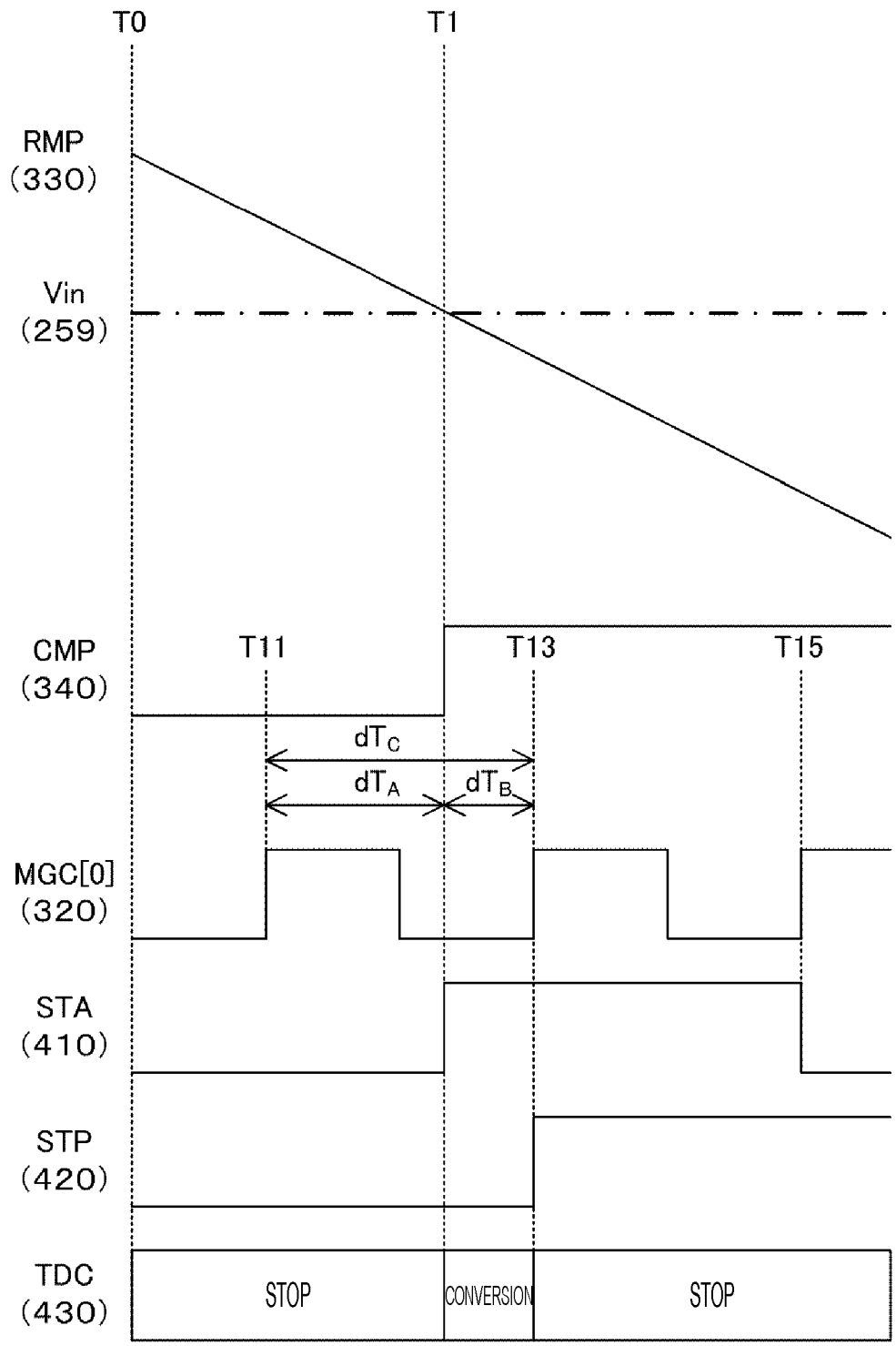
FIG. 7 is a timing chart illustrating an example of operation of the solid-state image sensor according to the first embodiment of the present technology.

FIG. 7 is a timing chart illustrating an example of operation of the solid-state image sensor 200 according to the first embodiment of the present technology. The drawing illustrates, for example, operation within an AD conversion period of the reset level.

From the timing T0, which is a start timing of the AD conversion period, the reference signal RMP is lowered with time. Then, the pixel signal Vin and the reference signal RMP substantially coincide with each other at the timing T1. The comparator 340 inverts the comparison result CMP from the low level to the high level at the timing T1.

The least significant bit MGC [0] output from the Gray code counter 320 fluctuates at a predetermined period of time. For example, the least significant bit MGC [0] changes from the low level to the high level at timings T11, T13, and T15. For example, the timing T11 is a timing before the timing T1 at which the comparison result CMP is inverted, and the timings T13 and T15 are timings after the timing T1. When the comparison result is inverted at the timing T1, the high-order code MGC at the timing T11 is held in the latch circuit 350.

The start signal generation unit 410 generates a high-level start signal STA within a period from the timing T1 to the timing T15. Furthermore, the end signal generation unit 420 generates a high-level end signal STP from the timing T13.

The TDC 430 converts, into a digital signal, a time from the timing T1 at which the start signal STA rises to the timing T13 at which the end signal STP rises. The low-order code LGC is latched immediately after the timing T13, but the ring oscillators in the Gray code TDC 400 continue oscillation at this time. The ring oscillators are powered down at the timing T15 when the start signal STA reaches the low level. Furthermore, the TDC 430 stops the time-to-digital conversion operation in a period up to the timing T1 and in a period from the timing T13.

Furthermore, a period $dT_C$ from the timing T11 to the timing T13 corresponds to a period of the least significant bit MGC [0], and represents time resolution of the Gray code counter 320. As described above, time resolution of the Gray code counter 320 is lower than time resolution of the Gray code TDC 400. Therefore, an error occurs between the timing T11 indicated by the high-order code MGC held by the latch circuit 350 and the timing T1 at which the comparison result is inverted. A period $dT_A$ from the timing T11 to the timing T1 corresponds to an error of the high-order code MGC.

It is desirable that the period $dT_A$ (error) can be directly measured by the Gray code TDC 400, but the Gray code TDC 400 cannot start measurement unless the comparison result CMP is inverted. The period measured by the Gray code TDC 400 is a period $dT_B$ from the timing T1 to the timing T13 at which the least significant bit MGC [0] reaches the high level.

The period $dT_A$ can be obtained by calculating a difference between a code corresponding to the period $dT_C$ and a code corresponding to the period $dT_B$, but it is necessary to add a circuit for calculating the difference to a subsequent stage. In order to avoid this, the Gray code TDC 400 counts down the low-order code LGC from an initial value. A value in a case where the low-order code LGC is counted up over the period $dT_C$ is set as the initial value.

For example, it is assumed that the data size of the low-order code LGC is 3 bits, and "100" is reached at the timing T13 in a case where the low-order code LGC is counted up from an initial value "000" over the period $dT_C$. In this case, an initial value "100" is set to the low-order code LGC at the timing T1. Then, the Gray code TDC 400 counts down the low-order code LGC from the initial value "100". By this control, a value of the low-order code LGC at the timing T13 is a value in a case where the low-order code LGC is counted up over the period $dT_A$. Such a counting operation eliminates need for a circuit for calculating a difference in the subsequent stage.

Here, there is a configuration assumed as a first comparative example in which AD conversion is performed only by the comparator 340 and the Gray code TDC 400, without the Gray code counter 320 being provided. Furthermore, there is a configuration assumed as a second comparative example in which AD conversion is performed only by the comparator 340 and the Gray code counter 320 without the Gray code TDC 400 being provided.

In the first comparative example, the time resolution can be set higher than the time resolution in the second comparative example, but it is necessary to continuously operate the Gray code TDC 400 over the period from the timing T0 to the timing T1, and thus power consumption is larger than power consumption in the second comparative example.

Meanwhile, in a configuration using both the Gray code TDC 400 and the Gray code counter 320, it is not necessary to operate the Gray code TDC 400 within the period from the timing T0 to the timing T1 as exemplified in the drawing, and thus the time-to-digital conversion operation can be stopped. Because an operation period of the Gray code TDC 400 until a ring oscillator stops is only required to be a period shorter than a period up to the timing T1 (the period from the timing T1 to the timing T15), the power consumption of the Gray code TDC 400 can be reduced to smaller than power consumption in the first comparative example. Note that it is necessary to add the Gray code counter 320, but the power consumption of the Gray code counter 320 is smaller than power consumption of the Gray code TDC 400, and thus the power consumption of an entire ADC is smaller than power consumption in the first comparative example. However, in a case where both the Gray code TDC 400 and the Gray code counter 320 are used, the power consumption is larger than power consumption in the second comparative example.

Furthermore, if both the Gray code TDC 400 and the Gray code counter 320 are used, an error of the Gray code counter 320 (that is, the period $dT_A$) can be calculated by the Gray code TDC 400. Therefore, the resolution of the ADC is equivalent to the resolution in the first comparative example and higher than the resolution in the second comparative example.

In summary, by using both the Gray code TDC 400 and the Gray code counter 320, it is possible to reduce power consumption as compared with the first comparative example while maintaining resolution equivalent to resolution in the first comparative example. Furthermore, although the power consumption is increased as compared with the second comparative example, the resolution can be improved as compared with the second comparative example.

Note that, although the Gray code counter 320 is used as a counter, a counter (Johnson counter or the like) other than the Gray code counter 320 can be used as long as the counter has relatively low power consumption.

Figure 8:
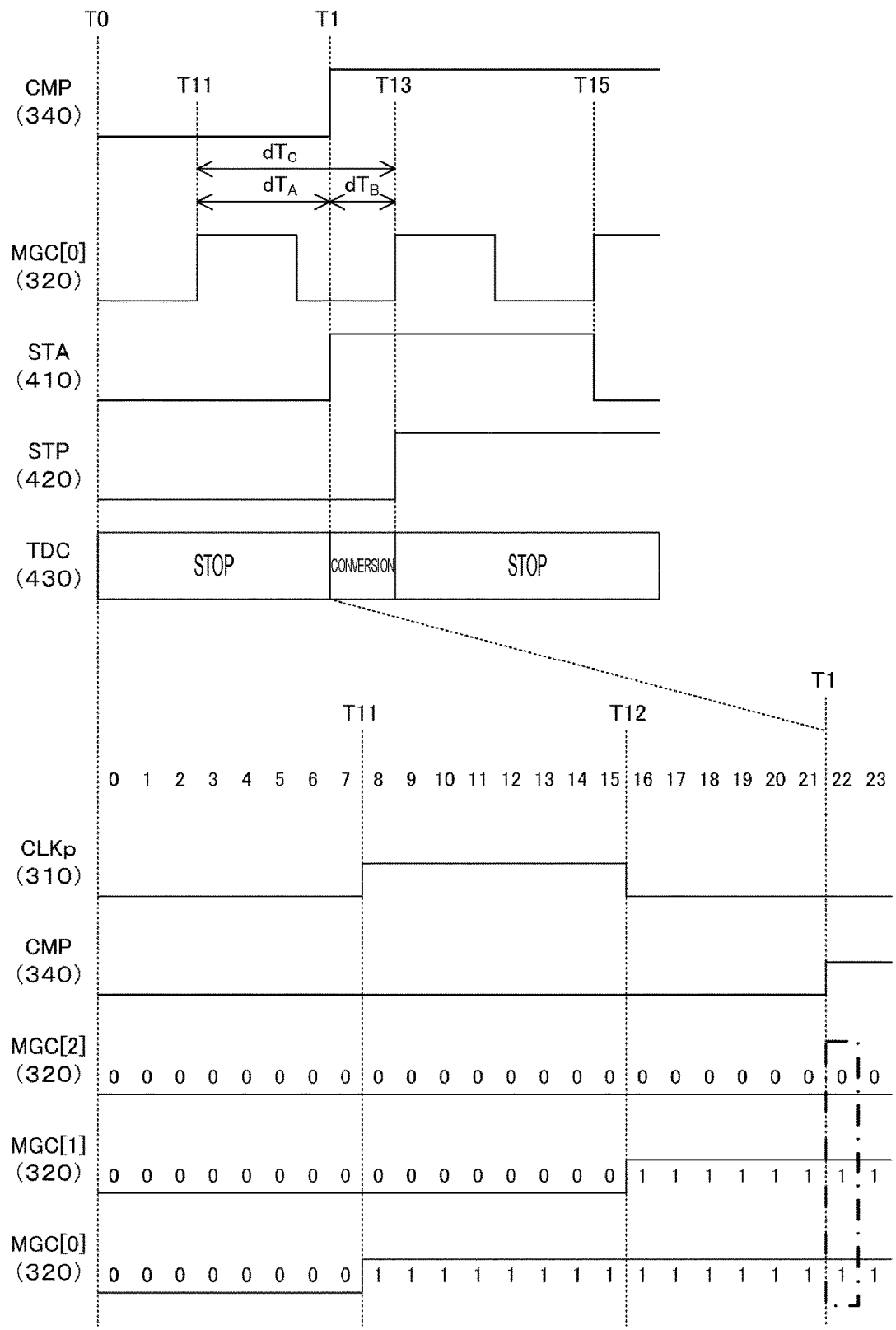
FIG. 8 is a timing chart illustrating an example of fluctuation of high-order codes according to the first embodiment of the present technology.

FIG. 8 is a timing chart illustrating an example of fluctuation of high-order codes according to the first embodiment of the present technology. The phase-locked loop circuit 310 supplies the clock signal CLKp, and the Gray code counter 320 updates the high-order code MGC in synchronization with the clock signal CLKp. The data size of the high-order code MGC is, for example, 3 bits.

The Gray code counter 320 initializes the high-order code MGC to "000" at the timing T0. Then, the Gray code counter 320 updates the high-order code MGC to "001" at the timing T11 at which the clock signal CLKp rises. The Gray code counter 320 updates the high-order code MGC to "011" at the timing T12 at which the clock signal CLKp falls.

Then, when the comparison result CMP is inverted at the timing T1 immediately after the timing T12, the latch circuit 350 holds "011" that is a value of the high-order code MGC at that time. Codes surrounded by an alternate long and short dash line in the drawing indicate high-order codes MGC to be held. Meanwhile, in a period up to the timing T1, the Gray code TDC 400 is stopped.

Figure 9:
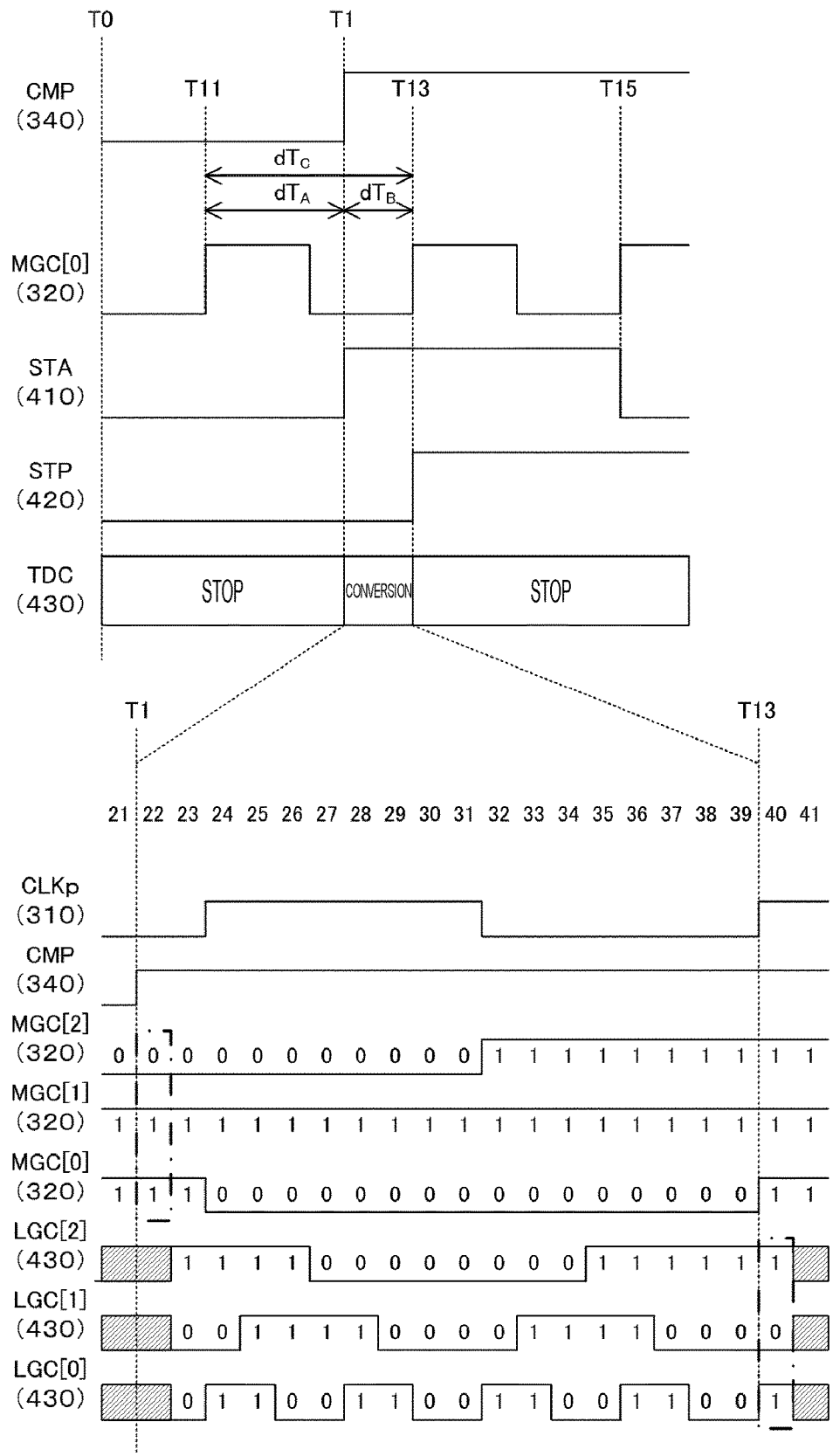
FIG. 9 is a timing chart illustrating an example of fluctuation of high-order codes and low-order codes according to the first embodiment of the present technology.

FIG. 9 is a timing chart illustrating an example of fluctuation of high-order codes and low-order codes according to the first embodiment of the present technology. When the comparison result CMP is inverted at the timing T1, immediately thereafter, the Gray code TDC 400 sets the low-order code LGC to an initial value. If the data size of the low-order code LGC is 3 bits, for example, the low-order code LGC is initialized to "100". As described above, the initial value corresponds to a value in a case where the Gray code TDC 400 counts up the low-order code LGC over the period $dT_C$.

Then, the Gray code TDC 400 counts down the low-order code LGC over a period until the timing T13 at which the LSB (that is, MGC [0]) of the high-order code MGC reaches the high level, and the low-order code LGC is updated to "101" immediately after the timing T13, and latched. As described above, the value corresponds to a value in a case where the low-order code LGC is counted up over the period $dT_A$. Furthermore, the Gray code TDC 400 stops the time-to-digital conversion immediately after the timing T13. Codes surrounded by an alternate long and short dash line in the drawing indicate latched low-order codes LGC. Note that, at the timing T13, the ring oscillators in the Gray code TDC 400 continue oscillation. The ring oscillators are powered down at the timing T15 when the start signal STA reaches the low level.

A Gray code "011101" including the held high-order code MGC ("011") and the latched low-order code LGC ("101") is converted into a binary code by the decoder 360. The Gray code "011101" corresponds to a value in a case where the Gray code TDC 400 performs the time-to-digital conversion from the timing T0 to the timing T1 to generate a 6-bit Gray code.

As exemplified in FIGS. 8 and 9, by using both the Gray code TDC 400 and the Gray code counter 320, it is possible to achieve a resolution equivalent to a resolution in the first comparative example in which only the Gray code TDC 400 is used.

Figure 10:
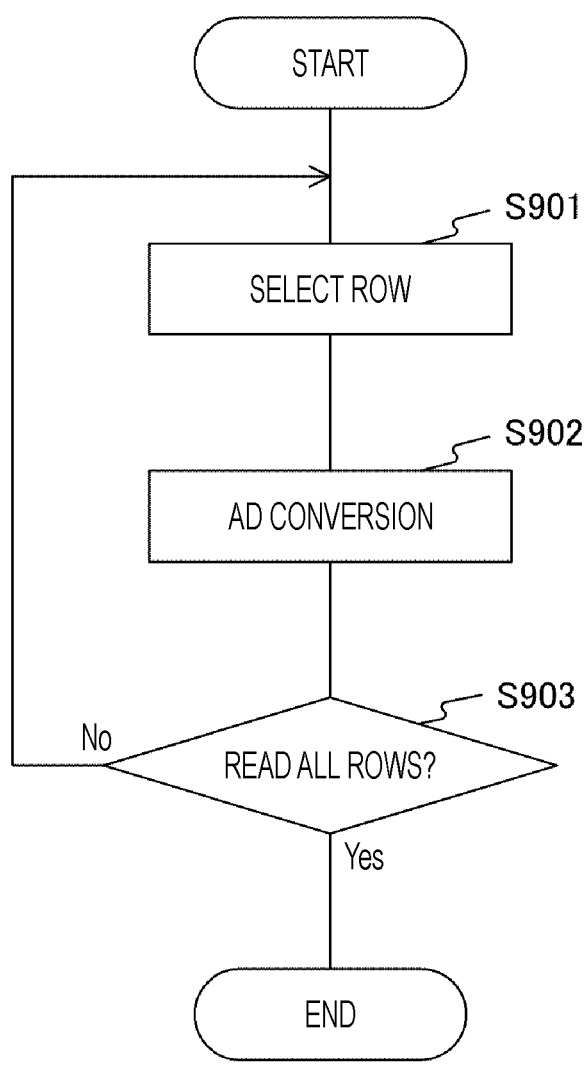
FIG. 10 is a flowchart illustrating an example of operation of the solid-state image sensor according to the first embodiment of the present technology.

FIG. 10 is a flowchart illustrating an example of operation of the solid-state image sensor 200 according to the first embodiment of the present technology. The operation is started, for example, when a predetermined application for capturing image data is executed.

The vertical scanning circuit 220 in the solid-state image sensor 200 selects and drives a row to be read (Step S901). The column ADC 300 performs AD conversion on a pixel signal for each column (Step S902). The vertical scanning circuit 220 determines whether or not reading of all rows has been completed (Step S903). In a case where the reading of all the rows has not been completed (Step S903: No), the solid-state image sensor 200 repeatedly executes Step S901 and subsequent steps.

Meanwhile, in a case where the reading of all the rows is completed (Step S903: Yes), the solid-state image sensor 200 ends operation for capturing an image. Note that, in a case where a plurality of pieces of image data is continuously captured, Steps S901 to S903 are repeatedly executed in synchronization with the vertical synchronization signal VSYNC. The AD conversion exemplified in FIGS. 6 to 9 is executed in Step S902 in FIG. 10.

Thus, in the first embodiment of the present technology, because the Gray code TDC 400 converts, into a digital signal, a time from when the comparison result CMP is inverted until the LSB reaches the high level, it is not necessary to perform the time-to-digital conversion until the comparison result CMP is inverted. Therefore, the Gray code TDC 400 can be stopped during a period until the comparison result CMP is inverted. With this arrangement, the power consumption of the column ADC 300 can be reduced as compared with the first comparative example in which the Gray code TDC 400 is operated during the period. Furthermore, because the Gray code TDC 400 having time resolution higher than time resolution of a counter is used, the resolution of the column ADC 300 can be improved as compared with the second comparative example in which only a counter is used.

2. Second Embodiment

In the first embodiment described above, the Gray code TDC 400 performs the time-to-digital conversion by using the ring oscillators, but delay times in the ring oscillators may vary due to an effect of a process, power supply voltage, and temperature. Such variations in characteristics (delay time and the like) due to the process, the power supply voltage, and the temperature are referred to as Process, Voltage, Temperature (PVT) variations. Due to the PVT variations, an error occurs in an oscillation frequency of the ring oscillators, and AD conversion accuracy of the column ADC 300 decreases. A solid-state image sensor 200 of a second embodiment is different from the solid-state image sensor 200 of the first embodiment in that an oscillation frequency of a ring oscillator is adjusted.

Figure 11:
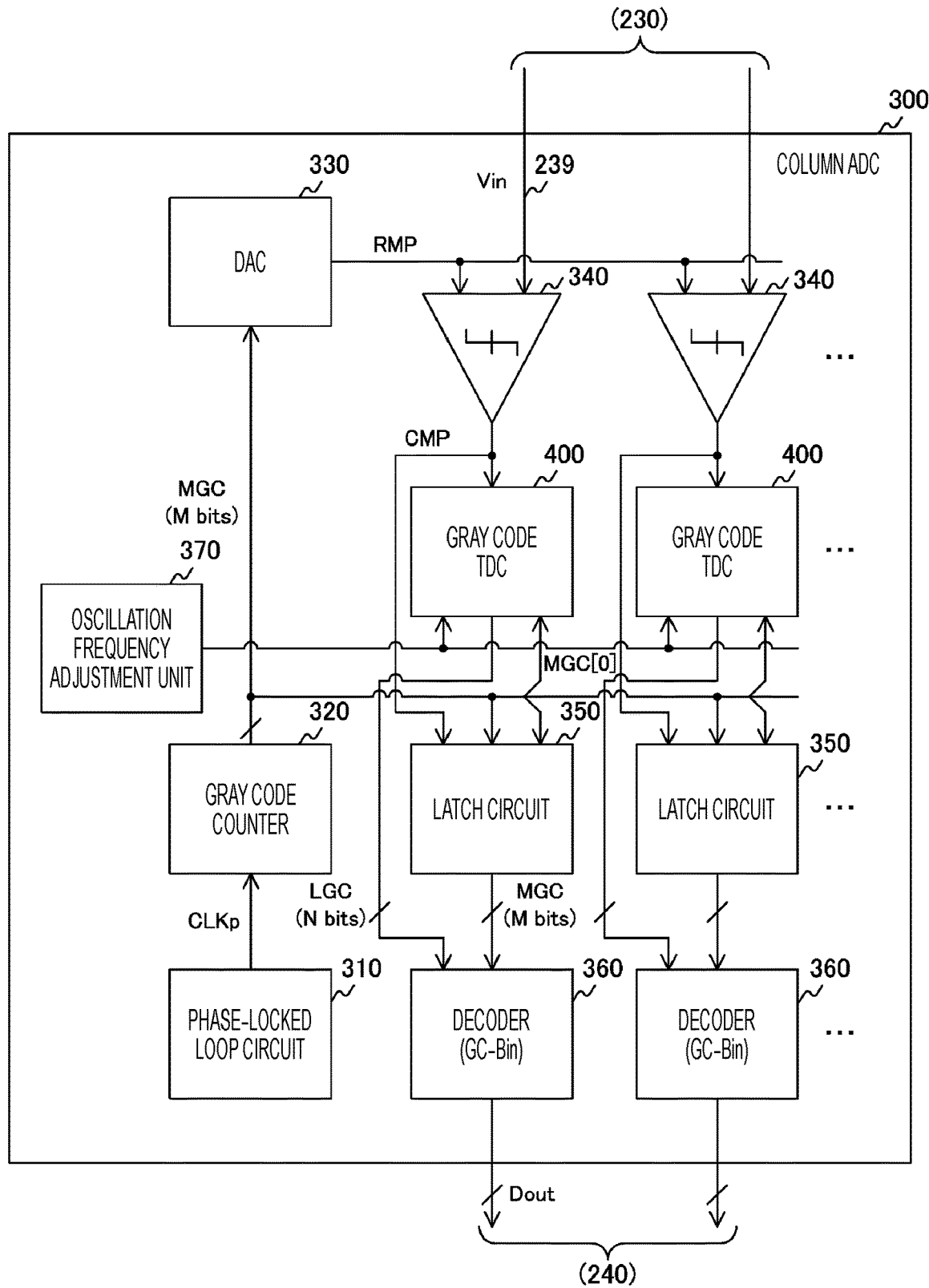
FIG. 11 is a block diagram illustrating a configuration example of a column ADC according to a second embodiment of the present technology.

FIG. 11 is a block diagram illustrating a configuration example of the column ADC 300 according to the second embodiment of the present technology. The column ADC 300 of the second embodiment is different from the column ADC 300 of the first embodiment in further including an oscillation frequency adjustment unit 370.

The oscillation frequency adjustment unit 370 adjusts an oscillation frequency of the ring oscillator in a Gray code TDC 400 in each column. Adjustment of the oscillation frequency is executed, for example, at a time of product shipment or repair, or outside an AD conversion period in a period in which the solid-state image sensor 200 is active after shipment. With the adjustment of the oscillation frequency, the oscillation frequency can be calibrated to a design value, and a decrease in AD conversion accuracy of the column ADC 300 due to the PVT variations can be reduced.

Note that, although one oscillation frequency adjustment unit 370 is shared by all columns, the oscillation frequency adjustment unit 370 may be provided for each of the columns to adjust an oscillation frequency for each column.

Figure 12:
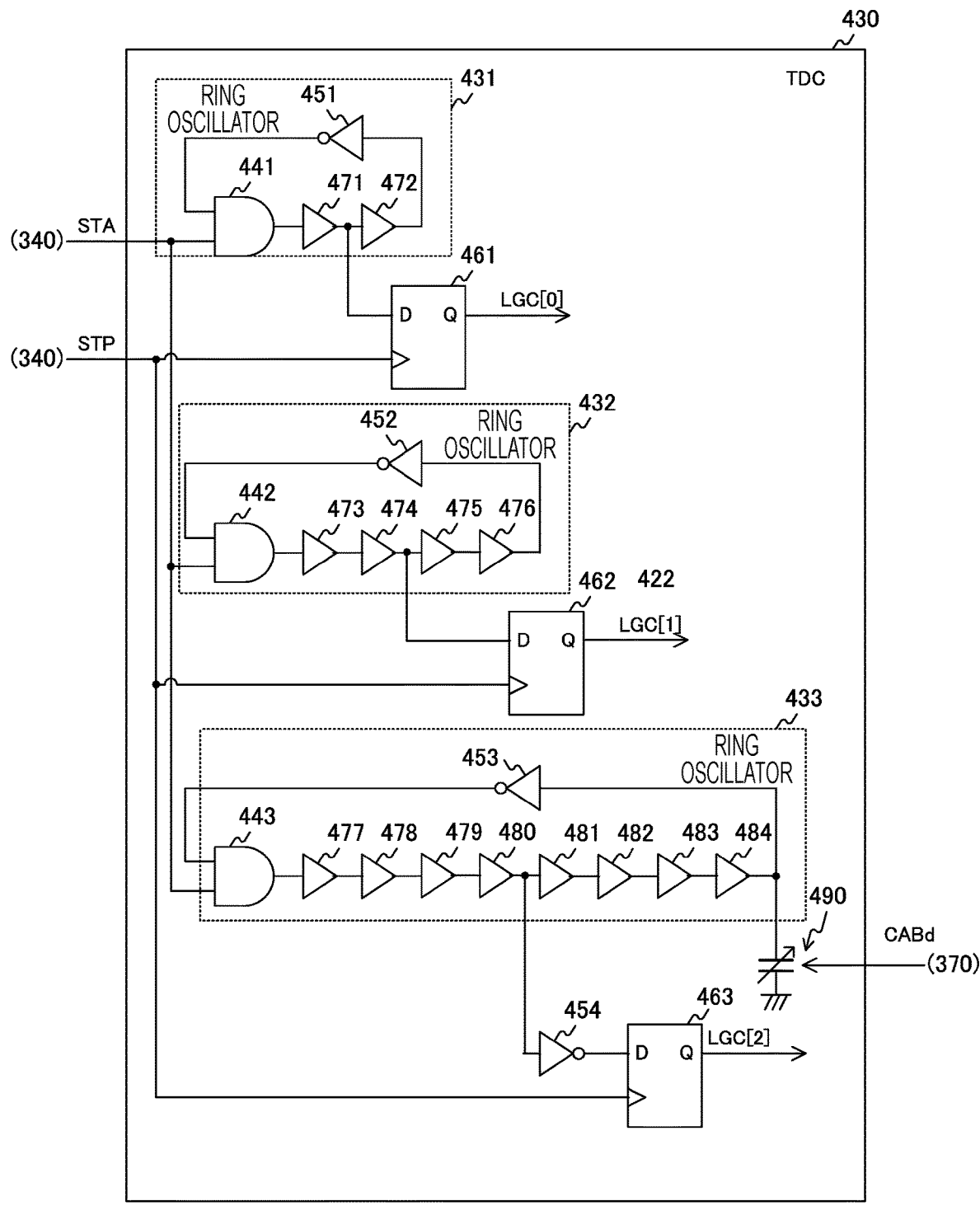
FIG. 12 is a circuit diagram illustrating a configuration example of a TDC according to the second embodiment of the present technology.

FIG. 12 is a circuit diagram illustrating a configuration example of a TDC 430 according to the second embodiment of the present technology. The TDC 430 of the second embodiment is different from the TDC 430 of the first embodiment in further including a variable capacitor 490.

The variable capacitor 490 is inserted, for example, between a connection node of a buffer 484 and an inverter 453, and a ground terminal. The variable capacitor 490 changes a capacitance value thereof according to a control signal CABd from the oscillation frequency adjustment unit 370. A delay time of an AC signal in a ring oscillator 433 fluctuates according to the change in the capacitance value. A period $T_{RO}$ of the ring oscillator 433 is expressed by, for example, the following formula.

$$T_{RO} = 2 \times (8 \times \tau_b + \tau_i + \tau_c) \qquad \text{Formula 1}$$

In the above formula, $\tau_b$ is a delay time of each of eight buffers 477 to 484. $\tau_i$ is a delay time of the inverter 453. $\tau_c$ is a delay time corresponding to a capacitance value of the variable capacitor 490. A unit of these delay times is, for example, seconds (s).

From Formula 1, the oscillation frequency adjustment unit 370 can change a capacitance value with the control signal CABd to adjust an oscillation frequency of the ring oscillator 433. The control signal CABd is assumed to be, for example, a digital signal.

Note that, although the oscillation frequency adjustment unit 370 adjusts an oscillation frequency of only the ring oscillator 433, the oscillation frequency adjustment unit 370 can also adjust an oscillation frequency of all of ring oscillators 431 to 433. In this case, a variable capacitor is connected to each of the ring oscillators 431 and 432, and a control signal is individually supplied to each of the variable capacitors.

Figure 13:
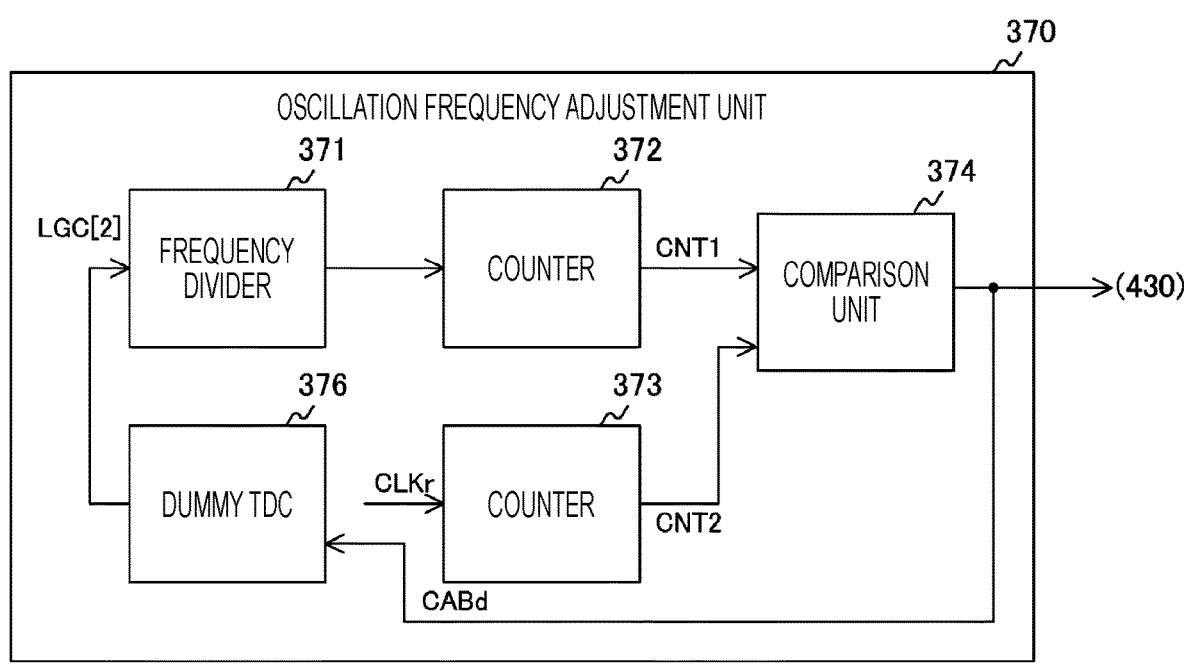
FIG. 13 is a block diagram illustrating a configuration example of an oscillation frequency adjustment unit according to the second embodiment of the present technology.

FIG. 13 is a block diagram illustrating a configuration example of the oscillation frequency adjustment unit 370 according to the second embodiment of the present technology. The oscillation frequency adjustment unit 370 includes a frequency divider 371, counters 372 and 373, a comparison unit 374, and a dummy TDC 376.

A circuit configuration of the dummy TDC 376 is similar to a circuit configuration of the TDC 430 exemplified in FIG. 12. However, in the dummy TDC 376, the LGC [2] (in other words, an AC signal) is output from an element corresponding to the buffer 484 to the inverter 453 and the oscillation frequency adjustment unit 370.

The frequency divider 371 divides a frequency of LGC [2] that is an AC signal from the dummy TDC 376. The frequency divider 371 supplies the counter 372 with an AC signal after the frequency division. In a case where there are no PVT variations, it is assumed that a frequency of the AC signal after frequency division coincides with a frequency of a predetermined reference clock signal CLKr.

The counter 372 counts a count value CNT1 in synchronization with the AC signal from the frequency divider 371. The counter 372 supplies the count value CNT1 to the comparison unit 374. Note that the counter 372 is an example of a first counter described in the claims.

The counter 373 counts a count value CNT2 in synchronization with the reference clock signal CLKr. The counter 373 supplies the count value CNT2 to the comparison unit 374. Note that the counter 372 is an example of a second counter described in the claims.

Furthermore, these counters 372 and 373 are simultaneously initialized at a predetermined timing, and start counting.

The comparison unit 374 compares the count value CNT1 of the counter 372 with the count value CNT2 of the counter 373, and generates a digital control signal CABd on the basis of a comparison result. The comparison unit 374 compares two count values of when a predetermined period has elapsed from a start of counting. Here, a value obtained by multiplying a frequency of the reference clock signal CLKr by a reciprocal of a frequency division ratio of the frequency divider 371 is set as a design value.

A discrepancy between the count values CNT1 and CNT2 means that a frequency of LGC [2] deviates from the design value. The comparison unit 374 adjusts the frequency of the LGC [2] to be a design value. For example, in a case where the count value CNT1 is smaller than the count value CNT2, the comparison unit 374 generates the control signal CABd for reducing the capacitance value of the variable capacitor 490. Meanwhile, in a case where the count value CNT1 is larger than the count value CNT2, the comparison unit 374 generates the control signal CABd for increasing the capacitance value of the variable capacitor 490. The control signal CABd is output to the dummy TDC 376 and the TDC 430 of each column.

Figure 14:
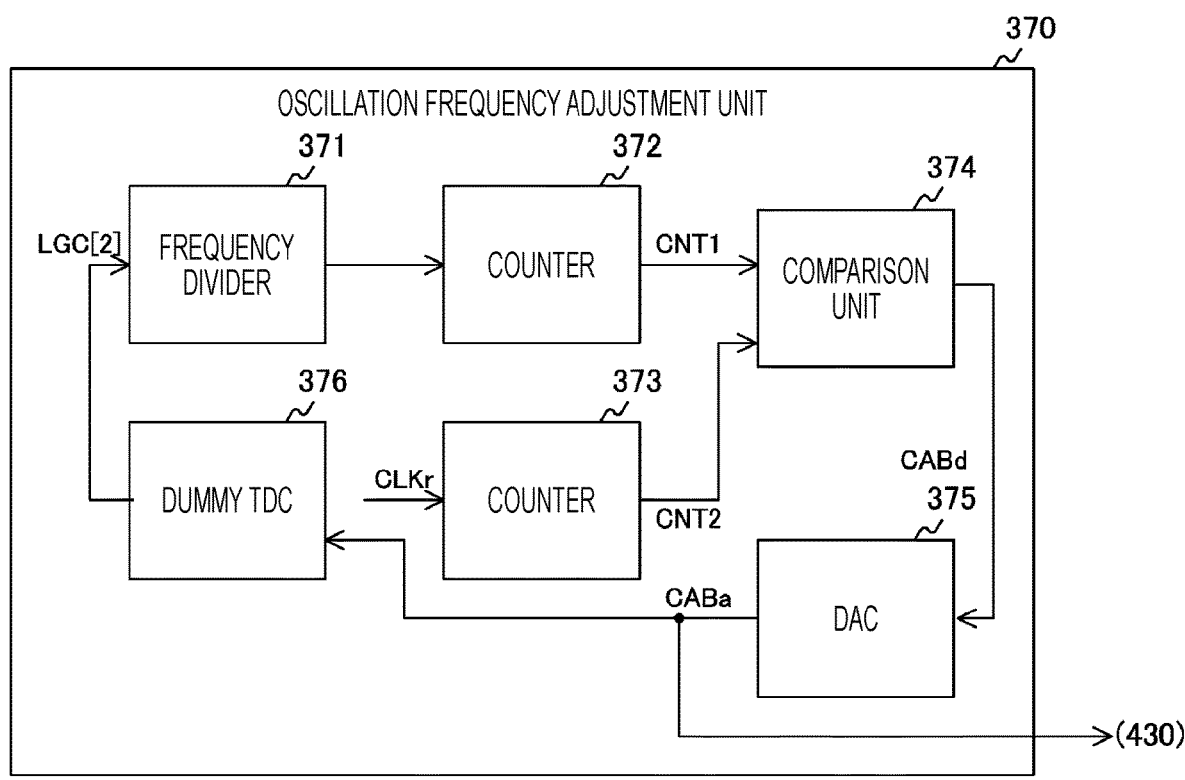
FIG. 14 is a block diagram illustrating a configuration example of the oscillation frequency adjustment unit of when outputting an analog signal according to the second embodiment of the present technology.

Note that, although the oscillation frequency adjustment unit 370 outputs the digital control signal CABd, the oscillation frequency adjustment unit 370 can also output an analog control signal. In this case, as exemplified in FIG. 14, a DAC 375 that converts the control signal CABd into CABa, which is an analog signal, is only required to be added. The DAC 375 is a digital-to-analog conversion unit described in the claims.

Thus, according to the second embodiment of the present technology, the oscillation frequency adjustment unit 370 adjusts the oscillation frequency of the ring oscillator 433, and therefore, it is possible to reduce a decrease in AD conversion accuracy of the column ADC 300 due to PVT variations.

3. Third Embodiment

In the first embodiment described above, the Gray code TDC 400 generates a low-order code LGC on the basis of the least significant bit MGC [0] from the Gray code counter 320, in which case delay times from input of the start signal STA to start of oscillation of the ring oscillators may vary due to PVT variations. Due to the variation in the delay times, accuracy of the low-order code LGC may decrease. A solid-state image sensor 200 of a third embodiment is different from the solid-state image sensor 200 of the first embodiment in that a decrease in accuracy is reduced by adjusting a delay time of a signal in a Gray code TDC 400.

Figure 15:
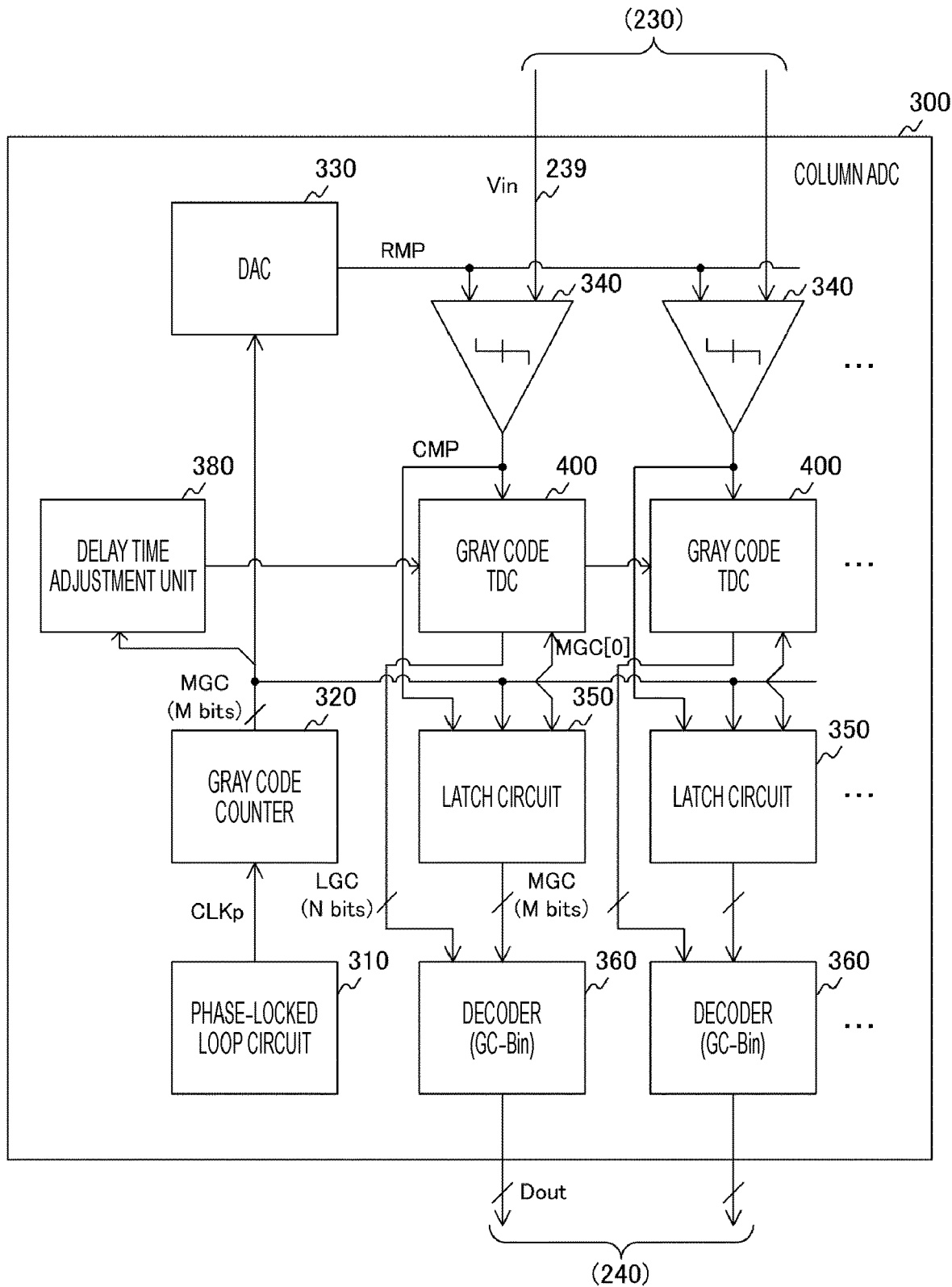
FIG. 15 is a block diagram illustrating a configuration example of a column ADC according to a third embodiment of the present technology.

FIG. 15 is a block diagram illustrating a configuration example of a column ADC 300 according to the third embodiment of the present technology. The column ADC 300 of the third embodiment is different from the column ADC 300 of the first embodiment in further including a delay time adjustment unit 380.

The delay time adjustment unit 380 adjusts a delay time of an end signal STP in the Gray code TDC 400 of each column. Adjustment of the delay time is executed, for example, at a time of product shipment or repair, or outside an AD conversion period in a period during which the solid-state image sensor 200 is active after shipment.

Note that, although one delay time adjustment unit 380 is shared by all columns, the delay time adjustment unit 380 may be provided for each of the columns to adjust a delay time for each column.

Figure 16:
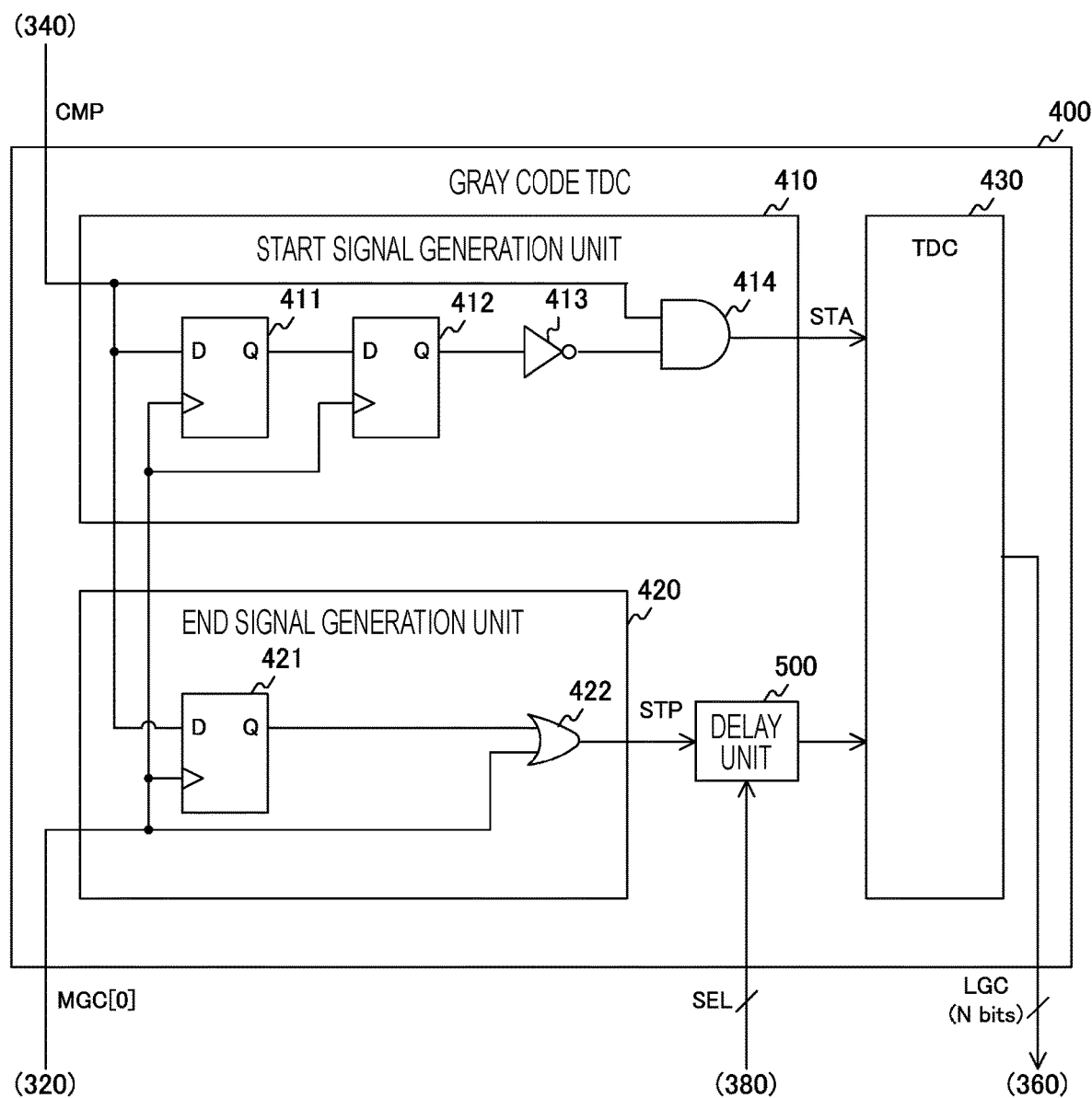
FIG. 16 is a circuit diagram illustrating a configuration example of a Gray code TDC according to the third embodiment of the present technology.

FIG. 16 is a circuit diagram illustrating a configuration example of a Gray code TDC 400 according to the third embodiment of the present technology. The Gray code TDC 400 of the third embodiment is different from the Gray code TDC 400 of the first embodiment in further including a delay unit 500.

The delay unit 500 delays the end signal STP from an end signal generation unit 420 over a predetermined delay time and supplies the delayed end signal STP to a TDC 430. A delay time of the delay unit 500 is adjusted by a selection signal SEL from the delay time adjustment unit 380. By adjusting the delay time of the end signal STP, it is possible to reduce a decrease in accuracy of the low-order code LGC due to PVT variations.

Figure 17:
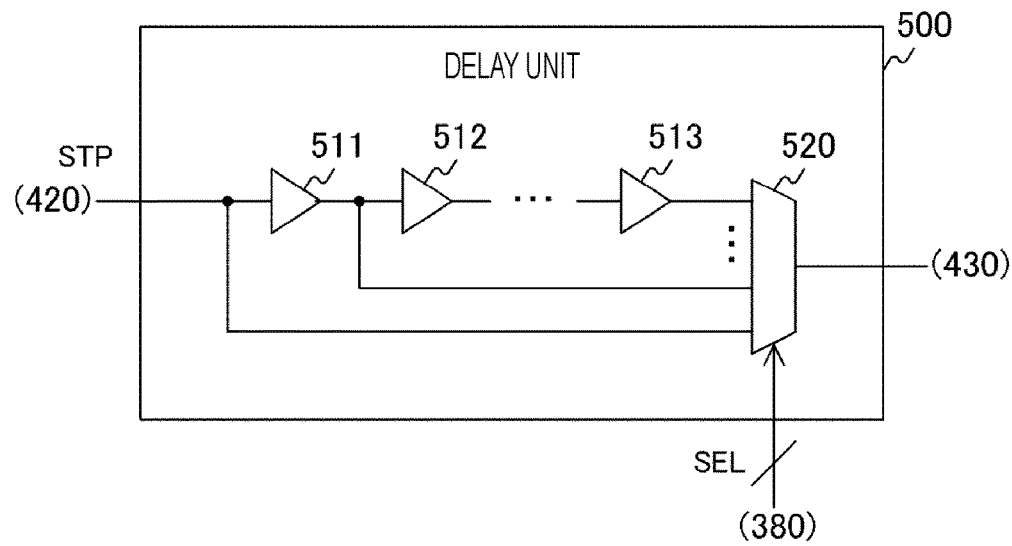
FIG. 17 is a circuit diagram illustrating a configuration example of a delay unit according to the third embodiment of the present technology.

FIG. 17 is a circuit diagram illustrating a configuration example of a delay unit 500 according to the third embodiment of the present technology. The delay unit 500 includes a D number of (D is an integer) buffers, such as buffers 511 to 513, and a multiplexer 520.

Each of the D number of buffers is connected in series to the end signal generation unit 420. The end signal STP before being delayed and the D number of delay signals from each of the buffers are input to the multiplexer 520.

The multiplexer 520 selects one of a D+1 number of signals according to the selection signal SEL and supplies the selected signal to the TDC 430.

Note that, although the delay unit 500 delays a signal with the D number of buffers, the signal can be delayed by an even number of inverters instead of by these buffers.

Figure 18:
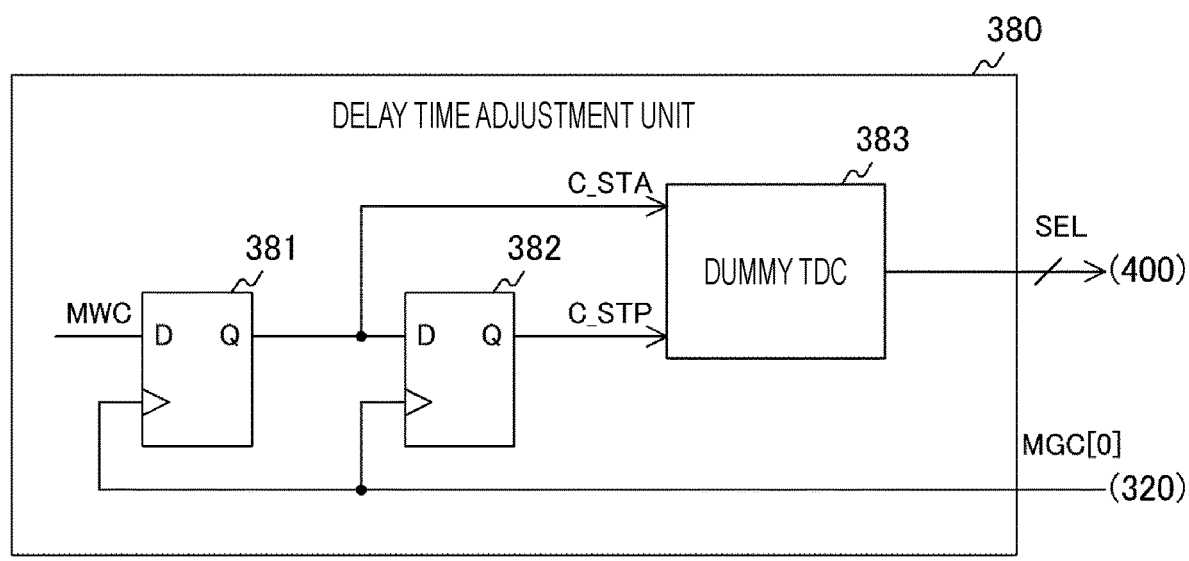
FIG. 18 is a block diagram illustrating a configuration example of a delay time adjustment unit according to the third embodiment of the present technology.

FIG. 18 is a block diagram illustrating a configuration example of the delay time adjustment unit 380 according to the third embodiment of the present technology. The delay time adjustment unit 380 includes flip-flops 381 and 382 and a dummy TDC 383.

The flip-flop 381 holds a measurement wake-up clock MWC in synchronization with a rise of a least significant bit MGC [0]. The measurement wake-up clock MWC is a signal indicating a start timing of adjustment of the delay time, and is generated by a timing control unit 210, for example. The flip-flop 381 supplies a held value as an adjustment start signal C_STA to the flip-flop 382 and the dummy TDC 383.

The flip-flop 382 holds the adjustment start signal C_STA from the flip-flop 381 in synchronization with the rise of the least significant bit MGC [0]. The flip-flop 382 supplies a held value to the dummy TDC 383 as an adjustment end signal C_STP.

The dummy TDC 383 converts, into a digital signal, a time from a rise of the adjustment start signal C_STA to a rise of the adjustment end signal C_STP, and generates a selection signal SEL on the basis of the digital signal.

A delay time from the rise of the adjustment start signal C_STA to a start of oscillation of a ring oscillator is measured. The delay time adjustment unit 380 adjusts a delay time of the delay unit 500 in accordance with cancellation of the measured delay time. Note that the dummy TDC 383 is an example of a dummy time-to-digital conversion circuit described in the claims.

Figure 19:
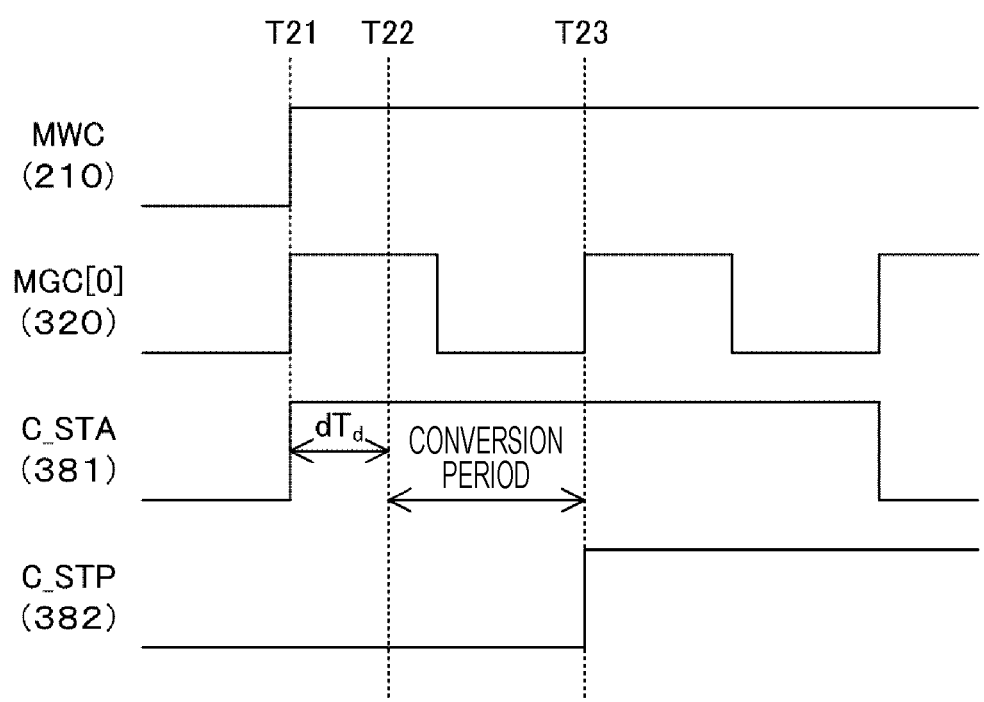
FIG. 19 is a timing chart illustrating an example of operation of the solid-state image sensor according to the third embodiment of the present technology.

FIG. 19 is a timing chart illustrating an example of operation of the solid-state image sensor 200 according to the third embodiment of the present technology. At a timing T21 at which adjustment of a delay time is started, the measurement wake-up clock MWC changes from a low level to a high level.

The flip-flop 381 holds a measurement wake-up clock MWC in synchronization with the rise of the least significant bit MGC [0], and outputs the measurement wake-up clock MWC as the adjustment start signal C_STA.

At a timing T23 at which the least significant bit MGC [0] rises next time, the flip-flop 382 outputs a high-level adjustment end signal C_STP.

The dummy TDC 383 measures a delay time $dT_d$ from the timing T21 to a timing T22 at which oscillation of a ring oscillator is started, and generates a selection signal SEL on the basis of the measured value. The delay time $dT_d$ is canceled by a delay time of an end signal by the selection signal SEL.

Note that the second embodiment can be applied to the third embodiment.

Thus, according to the third embodiment of the present technology, the delay time adjustment unit 380 adjusts the delay time of the end signal STP, and thus, it is possible to reduce a decrease in accuracy of the low-order code LGC due to PVT variations.

4. Example of Application to Mobile Object

The technology according to the present disclosure (the present technology) can be applied to various products. For example, the technology according to the present disclosure may be implemented as a device mounted on a mobile object of any kind such as an automobile, an electric vehicle, a hybrid electric vehicle, a motorcycle, a bicycle, a personal mobility, an airplane, a drone, a ship, or a robot.

Figure 20:
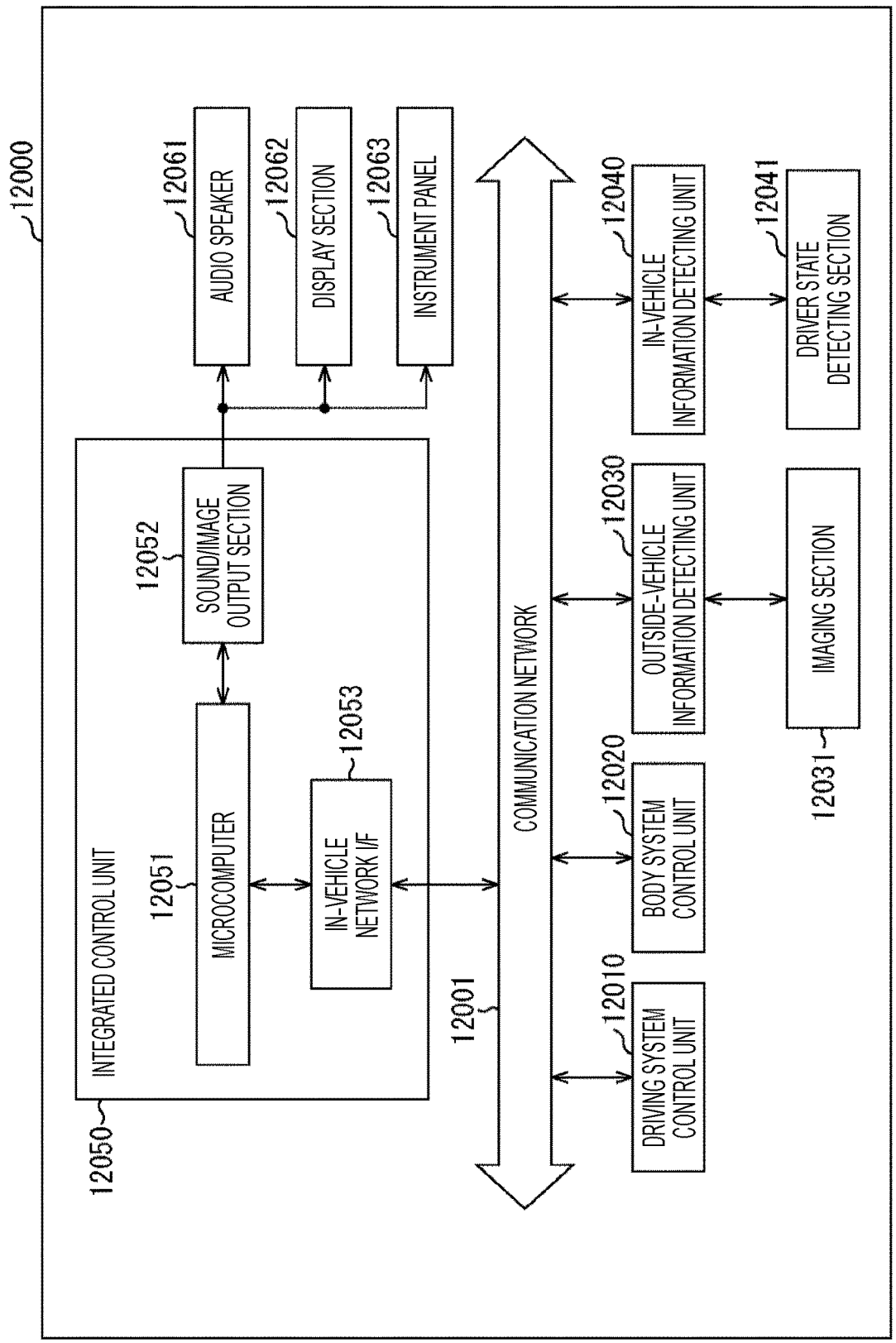
FIG. 20 is a block diagram illustrating a configuration example of a vehicle control system.

FIG. 20 is a block diagram illustrating an example of a schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example illustrated in FIG. 20, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and an in-vehicle network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

Furthermore, the microcomputer 12051 can output a control command to the body system control unit 12020 on the basis of information of outside of the vehicle, the information being acquired by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example in FIG. 20, an audio speaker 12061, a display section 12062, and an instrument panel 12063 are illustrated as the output device. The display section 12062 may, for example, include at least one of an on-board display and a head-up display.

Figure 21:
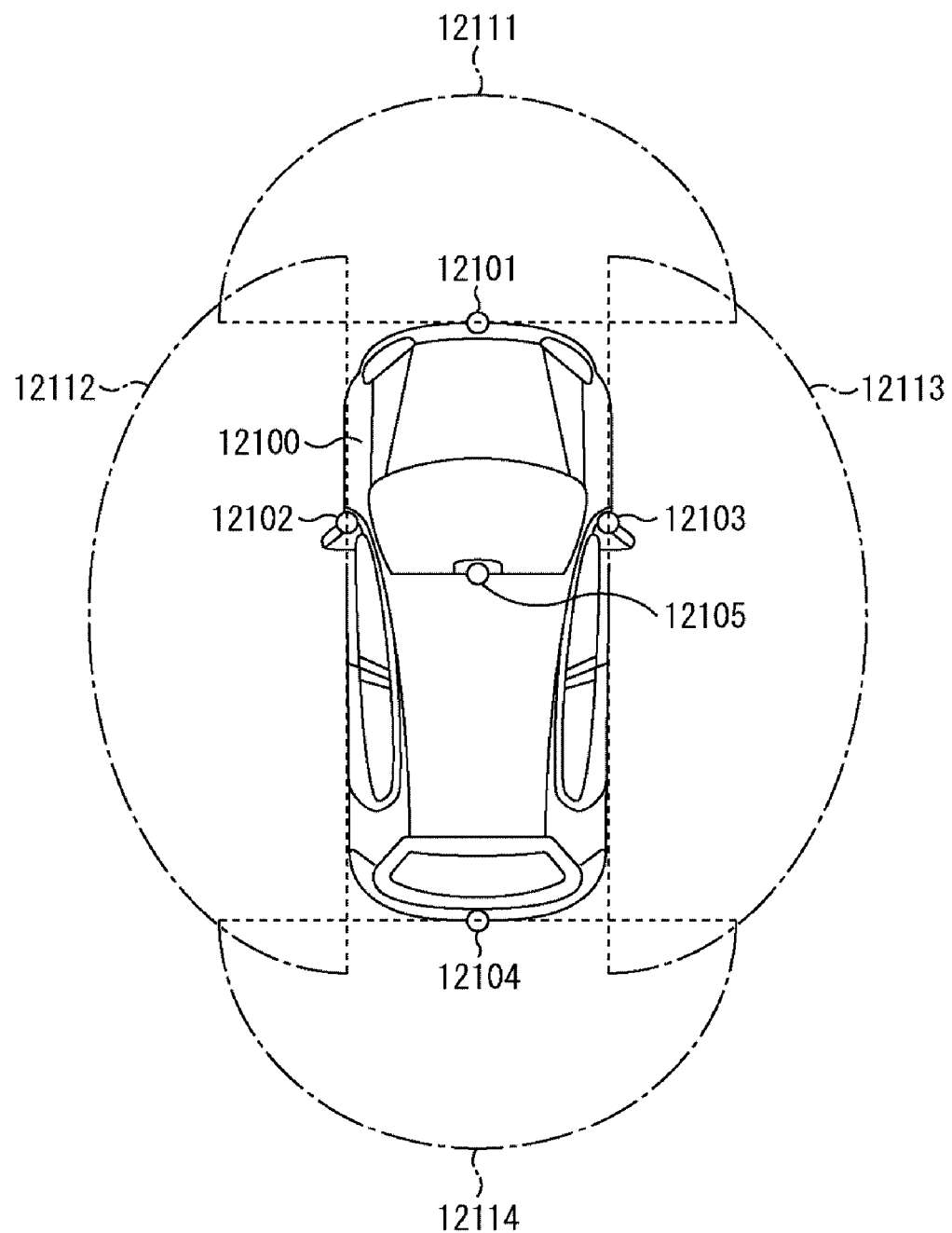
FIG. 21 is an explanatory diagram illustrating an example of an installation position of an imaging section.

FIG. 21 is a diagram illustrating an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are provided at positions such as, for example, a front nose, side mirrors, rear bumper, and back door of the vehicle 12100, and an upper part of a front window, or the like, of a vehicle interior of the vehicle 12100. The imaging section 12101 provided to the front nose and the imaging section 12105 provided to the upper portion of the windshield within the interior of the vehicle obtain mainly an image of the front of the vehicle 12100. The imaging sections 12102 and 12103 provided on the side mirrors mainly acquire images of views at sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of a vehicle control system to which the technology according to the present disclosure may be applied has been described above. The technology according to the present disclosure may be applied to, for example, the imaging section 12031 among the configurations described above. Specifically, the imaging device 100 in FIG. 1 can be applied to the imaging section 12031. By applying the technology according to the present disclosure to the imaging section 12031, power consumption of a system can be reduced.

Note that the above-described embodiments indicate examples for embodying the present technology, and matters in the embodiments and matters specifying the invention in the claims correlate to each other. Similarly, the matters specifying the invention in the claims and matters denoted by the same names in the embodiments of the present technology correlate to each other. However, the present technology is not limited to the embodiments, and can be embodied by performing various types of modifications on the embodiments within a range not departing from the gist of the technology.

Note that the effects described herein are only examples, and the effects of the present technology are not limited to these effects. Additional effects may also be obtained.

Note that the present technology can have the following configurations.

(1) An analog-to-digital conversion circuit including
a comparator that compares an analog signal and a predetermined reference signal, and outputs a comparison result,
a counter that counts a predetermined count value and outputs a bit string indicating the count value,
a time-to-digital converter that converts, into a digital signal, a time from when the comparison result is inverted until a least significant bit of the bit string reaches a predetermined value, and
a holding unit that holds the bit string of when the comparison result is inverted.

(2) The analog-to-digital conversion circuit according to (1),
in which the bit string and the digital signal are a Gray code.

(3) The analog-to-digital conversion circuit according to (1) or (2),
in which the time-to-digital converter generates the digital signal indicating a value counted down from a predetermined initial value over a time from when the comparison result is inverted until the least significant bit reaches the predetermined value, and
the initial value includes a value of when the time-to-digital converter counts up over a period of the least significant bit.

(4) The analog-to-digital conversion circuit according to any one of (1) to (3),
in which the time-to-digital converter includes
a ring oscillator that generates a predetermined alternating current signal, and
a variable capacitor that controls a delay time of the alternating current signal according to a predetermined control signal.

(5) The analog-to-digital conversion circuit according to (4), the analog-to-digital conversion circuit further including an oscillation frequency adjustment unit that adjusts, with the control signal, an oscillation frequency of the ring oscillator.

(6) The analog-to-digital conversion circuit according to (5),
in which the oscillation frequency adjustment unit includes
a frequency divider that divides a frequency of the alternating current signal,
a first counter that counts a first count value in synchronization with the alternating current signal of which frequency is divided,
a second counter that counts a second count value in synchronization with a predetermined reference clock signal, and
a comparison unit that generates a digital signal as the control signal on the basis of a result of comparing the first count value with the second count value.

(7) The analog-to-digital conversion circuit according to (6),
in which the oscillation frequency adjustment unit further includes a digital-to-analog converter that performs digital-to-analog conversion on the control signal.

(8) The analog-to-digital conversion circuit according to any one of (1) to (7),
in which the time-to-digital converter includes
a start signal generation unit that generates a start signal indicating a start timing of time-to-digital conversion on the basis of the comparison result and the least significant bit,
an end signal generation unit that generates an end signal indicating an end timing of the time-to-digital conversion on the basis of the comparison result and the least significant bit,
a delay unit that delays the end signal over a predetermined delay time, and
a conversion circuit that performs the time-to-digital conversion on the basis of the start signal and the delayed end signal to generate the digital signal.

(9) The analog-to-digital conversion circuit according to (8), further including
a delay time adjustment unit that adjusts the delay time.

(10) A solid-state image sensor including
a pixel that generates an analog signal with photoelectric conversion,
a comparator that compares the analog signal and a predetermined reference signal, and outputs a comparison result,
a counter that counts a predetermined count value and outputs a bit string indicating the count value,
a time-to-digital converter that converts, into a digital signal, a time from when the comparison result is inverted until a least significant bit of the bit string reaches a predetermined value, and
a holding unit that holds the bit string of when the comparison result is inverted.

(11) A method for controlling an analog-to-digital conversion circuit including
a comparison procedure for comparing an analog signal and a predetermined reference signal, and outputting a comparison result,
a counting procedure for counting a predetermined count value and outputting a bit string indicating the count value,
a time-to-digital conversion procedure for converting, into a digital signal, a time from when the comparison result is inverted until a least significant bit of the bit string reaches a predetermined value, and
a procedure for holding the bit string of when the comparison result is inverted.

REFERENCE SIGNS LIST

100 Imaging device
110 Optical unit
120 DSP circuit
130 Display unit
140 Operation unit
150 Bus 160 Frame memory
170 Storage unit
180 Power supply unit
200 Solid-state image sensor
210 Timing control unit
220 Vertical scanning circuit
230 Pixel array unit
231 Pixel
240 Horizontal transfer circuit
300 Column ADC
310 Phase-locked loop circuit
320 Gray code counter
330, 375 DAC
340 Comparator
350 Latch circuit
360 Decoder
370 Oscillation frequency adjustment unit
371 Frequency divider
372, 373 Counter
374 Comparison unit
376 Dummy TDC
380 Delay time adjustment unit
381, 382, 411, 412, 421, 461 to 463, Flip-flop
383 Dummy TDC
400 Gray code TDC
410 Start signal generation unit
413 Inverter
414, 441 to 443 AND (logical AND) gate
420 End signal generation unit
422 OR (logical OR) gate
430 TDC
431 to 433 Ring oscillator
451 to 454 Inverter
471 to 484, 511 to 513 Buffer
490 Variable capacitor
500 Delay unit
520 Multiplexer
12031 Imaging section

The invention claimed is:

1. An analog-to-digital conversion circuit, comprising:
a comparator configured to:
compare a first analog signal and a specific reference signal;
output a comparison result associated with the comparison of the first analog signal and the specific reference signal; and
invert the comparison result;
a counter configured to:
count a specific count value; and
output a bit string that indicates the specific count value;
a time-to-digital converter configured to:
determine a first value by a least significant bit of the bit string; and
convert a first time period into a digital signal, wherein
the first time period starts from a first time and ends at a second time,
the first time is associated with the inverted comparison result,
the second time is associated with the determined first value,
the time-to-digital converter includes a ring oscillator, and
the ring oscillator is configured to generate an alternating current signal;
an oscillation frequency adjustment unit that comprises a frequency divider wherein the frequency divider is configured to divide a frequency of the alternating current signal; and
a holding unit configured to hold the bit string at the first time.

2. The analog-to-digital conversion circuit according to claim 1, wherein each of the bit string and the digital signal is a Gray code.

3. The analog-to-digital conversion circuit according to claim 1, wherein
the time-to-digital converter is further configured to generate the digital signal,
the digital signal indicates a second value that is counted down from an initial value over a second time period,
the second time period starts from the first time and ends at the second time,
the initial value includes a third value associated with a third time,
at the third time, the time-to-digital converter is further configured to count up over a third time period of the least significant bit, and
the first time period, the second time period and the third time period are different from each other.

4. The analog-to-digital conversion circuit according to claim 1, wherein the time-to-digital converter further includes
a variable capacitor configured to control a delay time of the alternating current signal based on a specific control signal.

5. The analog-to-digital conversion circuit according to claim 4, wherein the oscillation frequency adjustment unit is configured to adjust an oscillation frequency of the ring oscillator based on the specific control signal.

6. The analog-to-digital conversion circuit according to claim 5, wherein the oscillation frequency adjustment unit includes:
a first counter configured to count a first count value in synchronization with the alternating current signal;
a second counter configured to count a second count value in synchronization with a specific reference clock signal; and
a comparison unit configured to:
compare the first count value and the second count value; and
generate the digital signal based on a result of the comparison of the first count value and the second count value, wherein the digital signal corresponds to the control signal.

7. The analog-to-digital conversion circuit according to claim 6, wherein
the oscillation frequency adjustment unit further includes a digital-to-analog converter,
the digital-to-analog converter is configured to convert the control signal into a second analog signal, and
the first analog signal and the second analog signal are different.

8. The analog-to-digital conversion circuit according to claim 1, wherein the time-to-digital converter further includes
a start signal generation unit configured to generate a start signal;
an end signal generation unit configured to generate an end signal;
a delay unit configured to delay the end signal over a specific delay time; and
a conversion circuit configured to:
perform a time-to-digital conversion based on the start signal and the delayed end signal; and generate the digital signal based on the time-to-digital conversion, wherein
the start signal indicates a start time of the time-to-digital conversion based on the comparison result and the least significant bit, and
the end signal indicates an end time of the time-to-digital conversion based on the comparison result and the least significant bit.

9. The analog-to-digital conversion circuit according to claim 8, further comprising a delay time adjustment unit configured to adjust the specific delay time.

10. A solid-state image sensor, comprising:
a pixel configured to generate an analog signal based on a photoelectric conversion;
a comparator configured to:
compare the analog signal and a specific reference signal;
output a comparison result associated with the comparison of the analog signal and the specific reference signal; and
invert the comparison result;
a counter configured to:
count a specific count value; and
output a bit string that indicates the specific count value;
a time-to-digital converter configured to:
determine a specific value by a least significant bit of the bit string; and
convert a time period into a digital signal, wherein
the time period starts from a first time and ends at a second time,
the first time is associated with the inverted comparison result,
the second time is associated with the determined specific value,
the time-to-digital converter includes a ring oscillator, and
the ring oscillator is configured to generate an alternating current signal;
an oscillation frequency adjustment unit that comprises a frequency divider wherein
the frequency divider is configured to divide a frequency of the alternating current signal; and
a holding unit configured to hold the bit string at the first time.

11. A method for controlling an analog-to-digital conversion circuit comprising:
comparing an analog signal and a specific reference signal;
outputting a comparison result associated with the comparison of the analog signal and the specific reference signal;
inverting the comparison result;
counting a specific count value;
outputting a bit string indicating the specific count value;
determining a specific value by a least significant bit of the bit string;
converting a time period into a digital signal, wherein
the time period starts from a first time and ends at a second time,
the first time is associated with the inverted comparison result,
the second time is associated with the determined specific value,
generating an alternating current signal;
dividing a frequency of the alternating current signal; and
holding the bit string at the first time.

* * * * *